United States Patent [19]
Ikeuchi et al.

[11] Patent Number: 5,563,898
[45] Date of Patent: Oct. 8, 1996

[54] SEMICONDUCTOR LASER DRIVE

[75] Inventors: Tadashi Ikeuchi; Hisako Watanabe; Kazuyuki Mori, all of Kawasaki, Japan

[73] Assignee: Fujitsu Limited, Kanagawa, Japan

[21] Appl. No.: 374,048

[22] Filed: Jan. 18, 1995

[30] Foreign Application Priority Data

Feb. 28, 1994 [JP] Japan ..................... 6-029356

[51] Int. Cl.$^6$ ...................................... H01S 3/00
[52] U.S. Cl. ............................... 372/38; 372/29
[58] Field of Search ............................ 372/38, 29, 30–32

[56] References Cited

U.S. PATENT DOCUMENTS

| | | | |
|---|---|---|---|
| 4,884,280 | 11/1989 | Kinoshita | 372/29 |
| 5,018,154 | 5/1991 | Ohashi | 372/29 |
| 5,025,447 | 6/1991 | Ohashi | 372/29 |
| 5,084,887 | 1/1992 | Ohashi | 372/38 |
| 5,123,023 | 6/1992 | Santarelli et al. | 372/29 |
| 5,127,015 | 6/1992 | Chikugawa et al. | 372/38 |
| 5,303,251 | 4/1994 | Zelenka | 372/29 |
| 5,412,677 | 5/1995 | Guerin et al. | 372/29 |

FOREIGN PATENT DOCUMENTS

| | | |
|---|---|---|
| 57-164589 | 10/1982 | Japan . |
| 2109384 | 4/1990 | Japan . |
| 3192784 | 8/1991 | Japan . |

OTHER PUBLICATIONS

Wittke et al; Stabilization of CW Injection Kasers; RCA Technical Notes; TN No.1005; Apr. 9,1975.

Primary Examiner—Leon Scott, Jr.

[57] ABSTRACT

A reference-voltage generator controls the level of a reference voltage in dependence upon temperature, and a drive-current supply unit passes a drive current through a semiconductor laser when the voltage of an input signal is greater than (or less than) the reference voltage. Even if a threshold-value current of the semiconductor laser increases owing to a rise in ambient temperature, as a result of which there is an increase in the delay time of the optical power waveform of the laser, the reference voltage declines in conformity with the temperature rise and the time at which drive current begins to flow into the semiconductor laser is made earlier. This offsets the delay time so that a stabilized optical power waveform and optical output power are generated. In addition, a drive-current controller increases the value of drive current in conformity with a rise in temperature. As a result, the drive current which flows through the semiconductor laser increases in dependence upon the temperature rise. A stabilized optical output power is thus generated.

16 Claims, 20 Drawing Sheets

FIG. 5A

CASE WHERE Vref IS VOLTAGE OF DUTY 50%

INPUT WAVEFORM DT

DRIVE CURRENT Ip

OPTICAL POWER

FIG. 5B

CASE WHERE Vref IS LESS THAN VOLTAGE OF DUTY 50%

FLUCTUATION IN POWER-SUPPLY VOLTAGE

SEMICONDUCTOR LASER DRIVE

BACKGROUND OF THE INVENTION

This invention relates to a semiconductor laser drive and, more particularly, to a semiconductor laser drive of an optical transmitter used in optical communication.

An increase in the speed of communication equipment and computers in recent years has been accompanied by growing demand for communication between apparatus by using light. Accordingly, an optical communication apparatus is required to be small in size, consume little electric power and have only a few locations requiring adjustment.

FIG. 20 is a block diagram showing a semiconductor laser drive in an optical transmitting apparatus according to the prior art. A semiconductor laser 1 emits light when a current which exceeds a threshold value flows through it. A drive current supply unit 2 passes a drive current $I_P$ through the semiconductor laser 1 when an input data signal DT, the level of which alternates in conformity with the "1", "0" logic of data, is smaller than a reference voltage $V_{ref}$, and a bias current supply unit 3 passes a prescribed bias current $I_B$ through the semiconductor laser 1. A drive-current controller 4 controls the magnitude of the drive current $I_P$, and a bias-current controller 5 controls the magnitude of the bias current $I_B$. The drive-current controller 4 and the bias-current controller 5 each have a variable resistor for adjusting the drive current $I_P$ and bias current $I_B$, respectively.

The relationship between the optical output of the semiconductor laser 1 and the current value is as illustrated in FIG. 21. According to the characteristic, light is not produced until a threshold-value current $I_{th}$ is attained. Once a value above the threshold-value current $I_{th}$ has been reached, the optical power increases in conformity with an increase in current. Accordingly, the bias-current controller 5 controls the bias current in such a manner that the relation $I_B \approx I_{th}$ is established, and the drive-current controller 4 controls the drive current $I_P$ in such a manner that a prescribed optical power $P_0$ is obtained. Further, if the characteristic of the semiconductor laser varies, as indicated by the dashed line in FIG. 21, owing to a variance in the element, the optical power $P_0'$ declines. This means that the bias current is controlled so as to establish the relation $I_B \approx I_{th}'$, and the drive-current controller 4 controls the drive current $I_P$ so as to obtain the prescribed optical power $P_0$.

FIG. 22 is a diagram showing the circuit construction of the semiconductor laser drive according to the prior art, in which components identical with those shown in FIG. 20 are designated by like reference characters. The drive current supply unit 2 includes a differential circuit DFAI composed of field-effect transistors (referred to as "FETs") Q1, Q2 whose respective inputs are the input data signal DT, the level of which alternates in conformity with the "1", "0" logic of data, and the reference voltage $V_{ref}$, a source-follower circuit SFL composed of FETs Q3, Q4 for adjusting the level of the differential output, and an output-side differential circuit DFAO composed of FETs Q5, Q6.

The data signal DT enters the gate terminal of the first FET Q1 constructing the differential circuit DFAI on the input side, the constant reference voltage (fixed) $V_{ref}$ enters the gate terminal of the second FET Q2, the gate terminals of the FETs Q1, Q2 are connected to a power-supply voltage $V_{SS}$ (negative polarity) via a constant-current source $I_0$, and the drain terminals of the FETs Q1, Q2 are connected to a power-supply voltage $V_{DD}$ (ground) via resistors R1, R2 and R3. When the input data signal DT is greater than the reference voltage $V_{ref}$, the FET Q1 turns on and the FET Q2 turns off. When the input data signal is smaller than the reference voltage $V_{ref}$, the FET Q1 turns off and the FET Q2 turns on.

Several diodes D1–D4 are inserted at the source terminals of the FETs Q3, Q4, which construct the source follower circuit SFL, in order to adjust level. The drain terminals of the FETs Q1, Q2 constructing the differential circuit DFAI on the input side are connected to the gate terminals of the FETs Q3, Q4, respectively, the drain terminals of the FETs Q3, Q4 are connected to the power-supply voltage $V_{DD}$ (ground), and the source terminals are connected to the power-supply voltage $V_{SS}$ (negative polarity) via the level adjusting diodes and constant-current sources $I_1$, $I_2$, respectively.

The drain terminal of the first FET Q5 constructing the differential circuit DFAO on the output side is connected to the power-supply $V_{DD}$ (ground), and the drain terminal of the second FET Q6 is connected to the semiconductor laser. The source terminals of the FETs Q3, Q4 of the source-follower circuit SFL are connected to the gate terminals of the FETs Q5, Q6, respectively, and the source terminals of the FETs Q5, Q6 are connected to the power-supply $V_{SS}$ via a third FET Q7 and a diode D5. The gate terminal of the third FET Q7 is connected to the drive-current controller 4, and the drive current $I_P$ is controlled by the gate-source voltage $V_{gs}$.

The bias-current supply unit 3 has a FET $Q_8$ and a diode D6. The drain terminal of the FET $Q_8$ is connected to the semiconductor laser 1, the gate terminal of the FET Q8 is connected to the bias-current controller 5, and the bias current $I_B$ is controlled by the gate-source voltage $V_{gs}$.

The drive-current controller 4 has a variable resistor VR1 connected between ground and the power-supply voltage $V_{SS}$, and the gate-source voltage of the FET Q7 of the drive-current supply unit 2 is adjusted to control the drive current $I_P$. The bias-current control unit 5 has a variable resistor VR2 connected between ground and the power-supply voltage $V_{SS}$, and the gate-source voltage of the FET Q8 of the bias-current supply unit 3 is adjusted to control the bias current $I_B$.

When the level of the input data signal DT is greater than the reference voltage $V_{ref}$ (i.e., when data="1" holds), the FET Q1 of the differential circuit DFAI turns on and the FET Q2 turns off. As a result, the FETs Q5, Q6 of the differential circuit on the output side turn on and off, respectively, and therefore the drive current $I_P$ does not flow through the semiconductor laser 1 and no light is produced. On the other hand, when the level of the input data signal DT is less than the reference voltage $V_{ref}$ (i.e., when data="0" holds), the FETs Q1 and Q2 of the differential circuit DFAI turn off and on, respectively. As a result, the FETs Q5, Q6 of the differential circuit on the output side turn off and on, respectively, and therefore the drive current $I_P$ flows through the semiconductor laser 1 so that light is produced and outputted. In this case, a desired optical power $P_0$ is obtained by adjusting the variable resistor VR1 of the drive-current controller 4 and the variable resistor VR2 of the bias-current controller 5.

The characteristic of optical power vs. current varies depending upon temperature, as shown in FIG. 23. In order to generate a constant optical power $P_0$ irrespective of temperature, therefore, it is necessary to control at least one of bias current and drive current in dependence upon a fluctuation in temperature. More specifically, in a case where the optical power $P_0$ is obtained at ordinary temperature with a bias current of $I_B$ and a drive current of $I_P$, it is required that the bias current and drive current be made say, $I_B'$, $I_P'$, respectively, in order to generate the same optical power $P_0$ at high temperature. Consequently, in the semiconductor laser drive according to the prior art, the diode D5 having a negative characteristic with respect to temperature is serially connected to the FET Q7 of the drive-current supply unit 2, and the diode D6 having a negative characteristic with respect to temperature is connected to the FET Q8 of the bias-current supply unit 3.

When the temperature rises, the voltage drop across each of the diodes D5, D6 decreases. As a result, the gate-source voltage $V_{gs}$ of each of the FETs Q7, Q8 becomes larger, there is an increase in the drain current of each FET, namely in the drive current $I_B$ and bias current $I_P$, and the current flowing into the semiconductor laser 1 increases. As a result, a reduction in optical power which accompanies the rise in temperature is compensated for so as to render the optical power approximately constant. Conversely, when the temperature falls, the voltage drop across each of the diodes D5, D6 increases. Consequently, the gate-source voltage $V_{gs}$ of each of the FETs Q7, Q8 becomes smaller, there is a decrease in the drive current $I_B$ and bias current $I_P$, and the current flowing into the semiconductor laser 1 decreases. As a result, a reduction in optical power which accompanies the rise in temperature is compensated for so as to render the optical power approximately constant.

Thus, in the semiconductor laser drive according to the prior art, a variance in the semiconductor laser characteristics is corrected for and a temperature compensating characteristic is imposed upon the drive current and bias current in the drive-current controller 4 and bias-current controller 5, thereby to stabilize the optical power. In order to obtain an excellent transmission characteristic, there is a need for an optical power waveform having a large extinction ratio (the ratio of optical power at "1" to optical power at "0") and an excellent eye aperture characteristic. With the conventional method of driving a semiconductor laser, therefore, the bias current is controlled in such a manner that $I_B \approx I_{th}$ is obtained.

A problem which arises is that owing to variance in the threshold-value current $I_{th}$ and a disparity in the temperature characteristic from one semiconductor laser to another, and depending upon the adjustment of the bias current, the relation $I_B \approx I_{th}$ cannot be achieved and there is a deterioration in the extinction ratio of optical power. In addition, the optical power waveform is crushed in the phase direction. As a result, a stable optical output cannot be obtained. More specifically, when the bias current $I_B$ is less than the threshold-value current $I_{th}(I_{B<Ith})$, the optical power develops an oscillation delay time $t_d$. This is represented generally by the following equation:

$$t_d = \tau s \cdot \log[I_P/(I_P + I_B - I_{th})] \qquad (1)$$

where τs represents carrier life and $I_P$ denotes the drive current.

When the adjustment of bias current or compensation for temperature is unsuccessful, the relation $I_{th} > I_B$ is established, the oscillation delay time $t_d$ in the optical power occurs, as shown in FIG. 24, and the optical power waveform is crushed in the phase direction. As a result, a stable optical output can no longer be obtained.

Further, in the conventional semiconductor laser drive, adjustments are required at three locations, namely adjustments of bias current, drive current and reference voltage.

Moreover, it is required that adjustments take into consideration both variance in elements and the temperature characteristics. Such adjustments are very difficult to carry out.

Furthermore, a constant-current circuit shown in FIG. 25 performs control of drive current, control of bias current and control of temperature characteristic according to the prior art. The circuit shown in FIG. 25 includes a FET Q, a diode D for temperature compensation and a variable resistor $V_R$. In accordance with this constant-current circuit, the variable resistor VR is adjusted to adjust the drain current $I_D$ (drive current $I_P$ or bias current $I_B$), and a fluctuation in optical power that accompanies a change in temperature is compensated for by the diode, as mentioned above. With this constant-current circuit, however, the gate-source voltage $V_{gs}$ of the FET varies owing to a fluctuation in the power supply and, hence, the drain current $I_D$ (drive current $I_P$ or bias current $I_B$) changes. FIG. 26 is a diagram illustrating the manner in which the drain current $I_D$ changes with respect to a fluctuation (0–±10%) in power-supply voltage $V_{SS}$. This shows a case in which drain current is 20 mA, 10 mA and 5 mA at a power-supply voltage fluctuation of zero. Thus, when drain current, i.e., drive current $I_P$, varies owing to a fluctuation in power-supply voltage, a problem which arises is a change in the optical output power. Further, if the bias current $I_B$ varies, a problem encountered is that the optical power waveform changes.

SUMMARY OF THE INVENTION

A first object of the present invention is to provide a semiconductor laser drive in which it is possible to simplify adjustment of bias current by imposing a temperature characteristic upon a reference voltage, and in which it is possible to eliminate adjustment of bias current or reduce the bias-current supply circuitry.

A second object of the present invention is to provide a semiconductor laser drive which is compact and has but few locations requiring adjustment.

A third object of the present invention is to provide a semiconductor laser drive in which a stabilized optical output power and a stabilized optical power waveform are obtained even if temperature fluctuates or even if there is a variance among elements.

A fourth object of the present invention is to provide a semiconductor laser drive in which drive current $I_P$ and bias current $I_B$ can be rendered substantially constant even if the power-supply fluctuates, whereby there are obtained a stabilized optical output power and a stabilized optical power waveform.

In accordance with the present invention, the first through third objects are attained by providing a semiconductor laser drive comprising a semiconductor laser, a drive-current supply unit for passing a drive current through the semiconductor laser when input voltage is greater than a reference voltage or less than the reference voltage, a drive-current controller for controlling a value of drive current, and a reference-voltage generator for outputting the reference voltage and for lowering the level of the reference voltage in conformity with a temperature rise.

In accordance with the present invention, the first through third objects are attained by providing a semiconductor laser drive comprising a semiconductor laser, a drive-current supply unit for passing a drive current through the semiconductor laser when input voltage is greater than a reference voltage or less than the reference voltage, a drive-current controller for increasing a value of drive current in conformity with a temperature rise, a monitoring light-receiving element for detecting optical power of the semiconductor laser, and a reference-voltage generator for generating the reference voltage in such a manner that the reference voltage is raised when the optical power is large and lowered when the optical power is small.

In accordance with the present invention, the first through third objects are attained by providing a semiconductor laser drive provided with a plurality of semiconductor laser drive sections each having a semiconductor laser, a drive-current supply unit for passing a drive current through the semiconductor laser when input voltage is greater than a reference voltage or less than the reference voltage, and a bias-current supply unit for passing a prescribed bias current through the semiconductor laser, each semiconductor laser drive section sharing a reference-voltage generator for generating a reference voltage having a level which declines in conformity with a temperature rise, a drive-current controller for increasing a value of drive current in conformity with a temperature rise, and a bias-current controller for controlling a value of bias current.

In accordance with the present invention, the fourth object is attained by providing a semiconductor laser drive comprising a bias-current supply unit and a drive-current supply unit so adapted that drive current $I_P$ or bias current $I_B$ is rendered approximately constant even if power-supply voltage fluctuates.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 5A and 5B are diagrams for describing a drive current waveform and optical power waveform conforming to an initially et value of reference voltage;

DESCRIPTION OF THE PREFERRED EMBODIMENTS (A) Overview of the Invention

Figure 1:
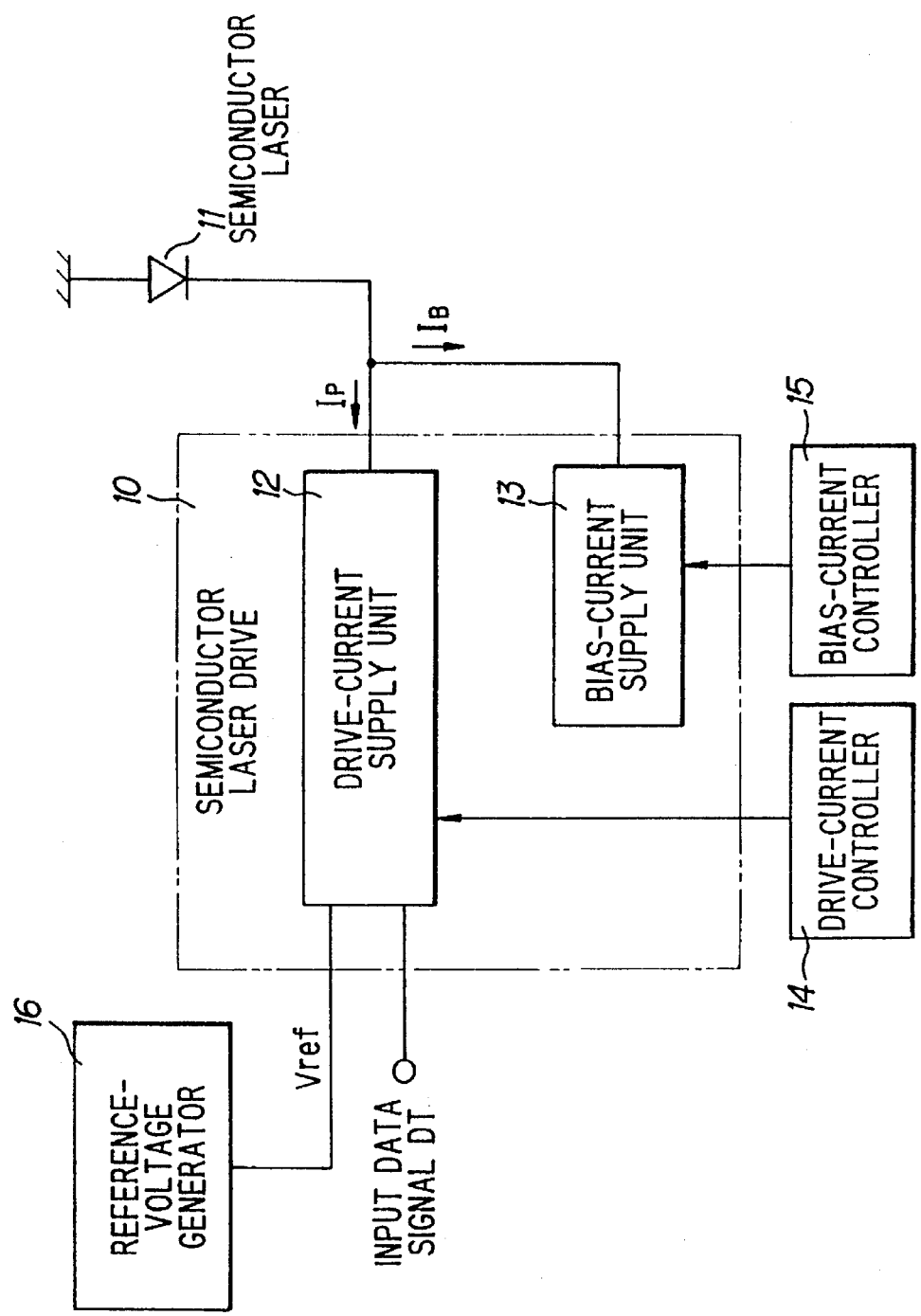
FIG. 1 is a diagram for describing an overview of the present invention.

FIG. 1 is a diagram for describing an overview of a semiconductor laser drive according to the present invention.

A semiconductor laser drive section 10 in FIG. 1 includes a drive-current supply unit 12 for passing a drive current $I_P$ through a semiconductor laser 11 when an input data signal DT (a signal the level of which alternates in conformity with the "1", "0" logic of data) is greater than a reference voltage $V_{ref}$ or less than the reference voltage $V_{ref}$, and a bias-current supply unit 13 for passing a prescribed bias current $I_B$ through the semiconductor laser 11. A drive-current controller 14 controls the magnitude of the drive current $I_P$, a bias-current controller 15 controls the magnitude of the bias current $I_B$, and a reference-voltage generator 16 generates the reference voltage $V_{ref}$ and lowers the level of the reference voltage $V_{ref}$ in conformity with a temperature rise.

The reference-voltage generator 16 lowers the level of the reference voltage $V_{ref}$ in conformity with a rise in temperature, and the drive-current supply unit 12 passes the drive current $I_P$ through the semiconductor laser 11 when the voltage of the input data signal DT is greater than (or less than) the reference voltage. If the threshold-value current $I_{th}$ of the semiconductor laser increases owing to a rise in temperature and, hence, the delay time $t_d$ grows larger, this arrangement makes it possible to lower the reference voltage $V_{ref}$ correspondingly to increase the duty of the drive-current output. In addition, the time at which current starts flowing into the semiconductor laser 11 can be made earlier. As a result, a stabilized optical output power is obtained. Moreover, by making the drive current flow earlier, the delay time is offset so that a stabilized optical power waveform is obtained.

Further, if the drive-current controller 14 is constructed in such a manner that the drive current $I_P$ increases in dependence upon a rise in temperature, the value of current that flows through the semiconductor laser 11 can be increased in conformity with the temperature rise, thereby making it possible to obtain an even more stable optical output power.

Furthermore, by controlling the reference voltage $V_{ref}$ or drive current $I_P$ depending upon a fluctuation in temperature, it is not always necessary to adjust the bias current. This means that the bias-current controller 15 or bias-current supply unit 13 can be curtailed. Adjustment can be facilitated or the points at which adjustment is necessary can be reduced.

In addition, in a case where a plurality of semiconductor laser drive sections 10 are provided, points at which adjustment are required can be reduced by a wide margin if the reference-voltage generator 16, drive-current controller 14 and bias-current controller 15 are provided so as to be shared by the plurality of semiconductor laser drive sections.

Furthermore, a constant-current circuit so adapted that a constant current will flow even if the power-supply voltage fluctuates is used as the bias-current supply unit 13 or drive-current supply unit 12. If this arrangement is adopted, the drive current $I_P$ or bias current $I_B$ can be rendered substantially constant even if the power-supply voltage fluctuates. This makes it possible to obtain a stabilized optical output power and optical power waveform.

(B) First Embodiment of the Invention (a) Construction

Figure 2:
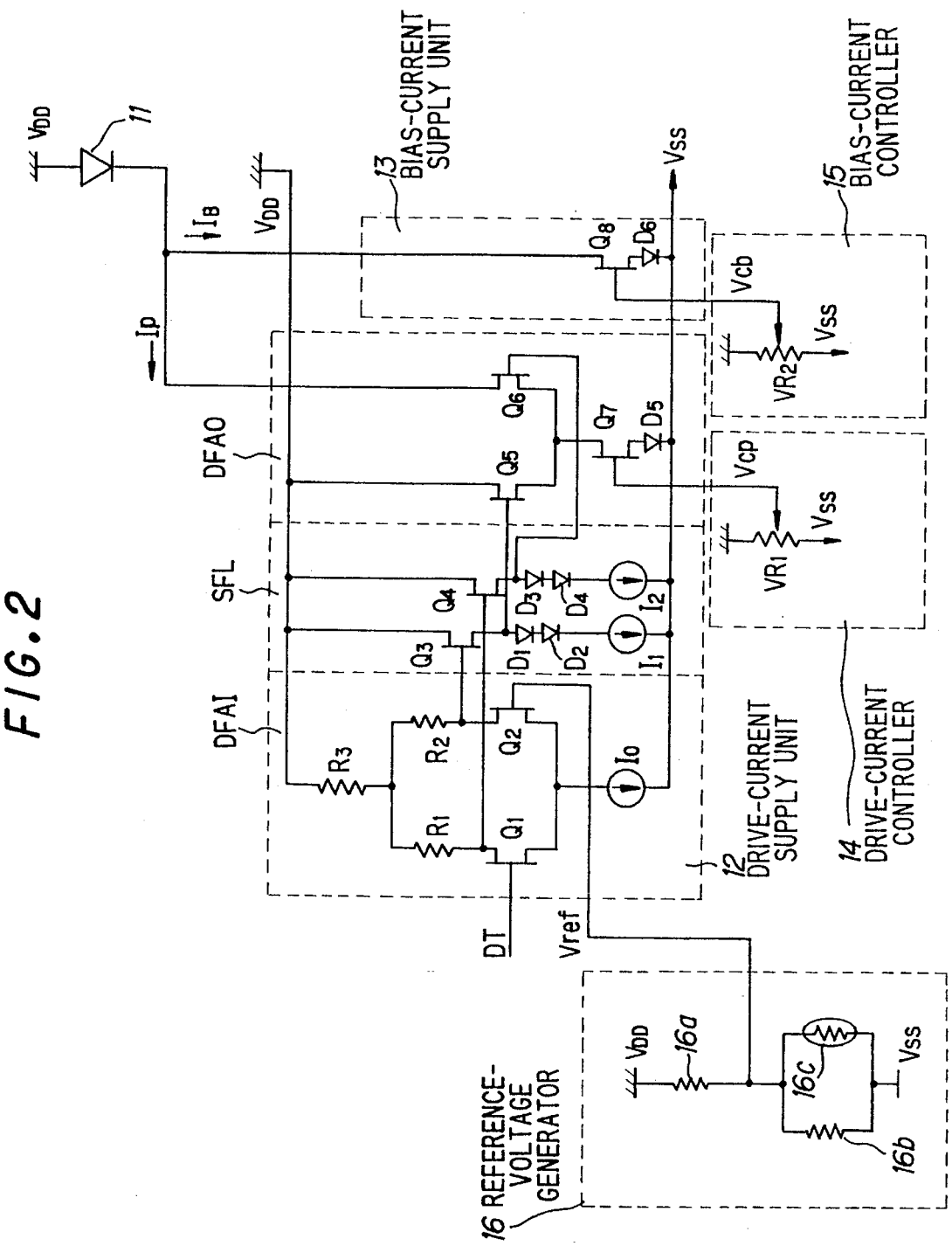
FIG. 2 is a diagram illustrating a first embodiment of the present invention.
Figure 22:
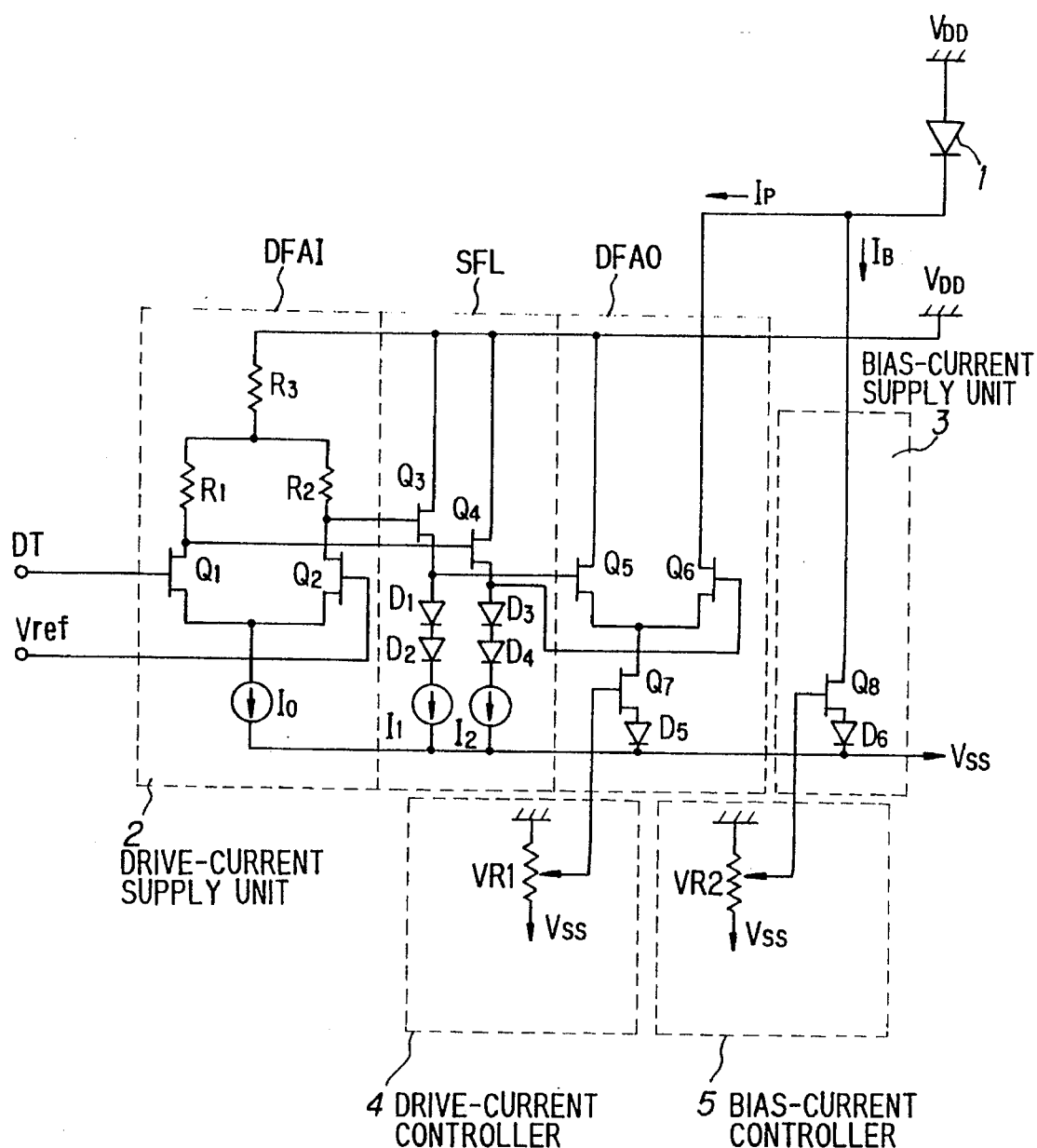
FIG. 22 is a diagram showing the construction of the circuitry of the semiconductor laser drive according to the prior art.

FIG. 2 is a diagram illustrating the construction of a semiconductor laser drive according to a first embodiment of the present invention. Shown in FIG. 2 are the semiconductor laser 11, the drive-current supply unit 12 for passing the drive current $I_P$ through the semiconductor laser 11 when the input data signal DT (a signal the level of which alternates in conformity with the "1", "0" logic of data) is less than the reference voltage $V_{ref}$ or (or greater than the reference voltage $V_{ref}$), the bias-current supply unit 13 for passing the prescribed bias current $I_B$ through the semiconductor laser 11, the drive-current controller 14 for controlling the magnitude value of the drive current $I_P$, the bias-current controller 15 for controlling the magnitude of the bias current $I_B$, and the reference-voltage generator 16 for generating the reference voltage $V_{ref}$ and for controlling the level of the reference voltage $V_{ref}$ in conformity with temperature. The drive-current supply unit 12, the bias-current supply unit 13, the drive-current controller 14 and the bias-current controller 15 have constructions the same as those shown in FIG. 22.

The reference-voltage generator 16 is constituted by a voltage-divider circuit composed of resistors 16a, 16b and a temperature-sensitive variable resistor element (thermister) 16c. Specifically, the resistor 16b and the thermister 16c are connected in parallel, the resistor 16a is connected in series with this parallel circuit and the overall resulting circuitry is inserted between the power-supply voltage $V_{DD}$ (ground) and $V_{SS}$ (negative polarity). The characteristic of the thermister 16c is such that its resistance value decreases with a rise in temperature. When the temperature rises, therefore, the level of the reference voltage $V_{ref}$ declines.

(b) Operation

The variable resistors VR1, VR2 of the drive-current controller 14 and bias-current controller 15, respectively, are adjusted on the basis of the characteristic of the semiconductor laser 11 at low temperature ($T_O$). The variable resistors VR1, VR2 are adjusted so as to obtain the prescribed optical power $P_0$ and in such a manner that the bias current $I_b$ will become equal to the threshold-value current. If the temperature rises under these conditions, the threshold-value current $I_{th}$ of the semiconductor laser 11 increases and the delay time dt becomes larger in accordance with Equation (1).

Figure 3:
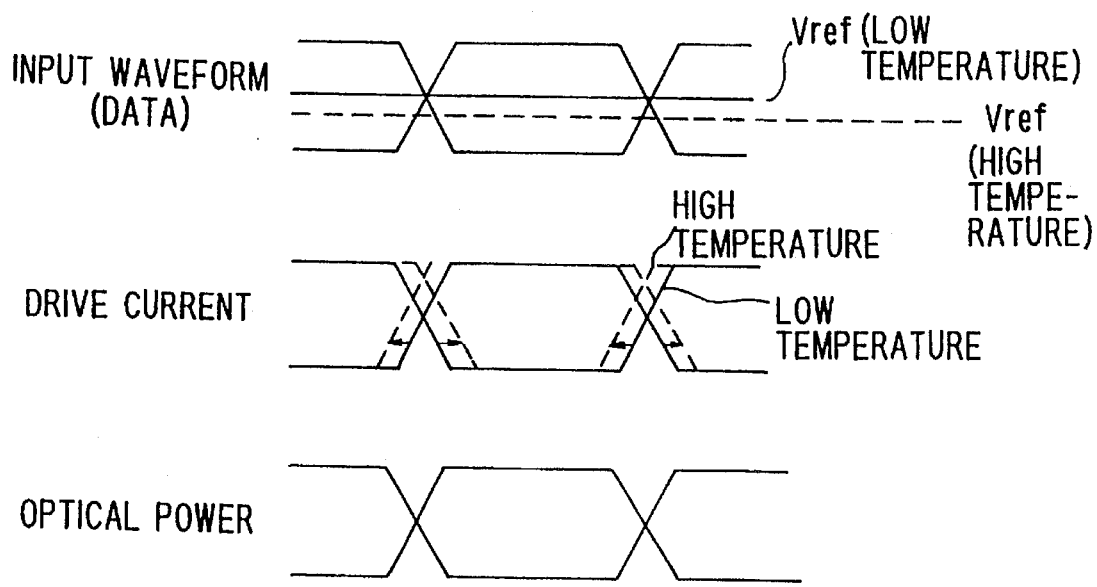
FIG. 3 is a waveform diagram for describing the operation of the first embodiment.

However, since the level of the reference voltage $V_{ref}$ falls with a rise in temperature, as shown in FIG. 3, the duty of the drive current increases, as indicated by the dashed line, and the drive current starts flowing into the semiconductor laser 11 at an earlier time. Owing to the earlier leading edge of the drive current, the delay time $t_d$ is offset and a stabilized optical power waveform is obtained. Further, if the temperature rises, the amplitude of the drive current $I_P$ decreases but the duty of the drive-current output is increases correspondingly so that the time during which the drive current is flowing into the semiconductor laser is prolonged. A stabilized optical output power is obtained as a result.

(c) Alternative Construction of Reference-Voltage Generator

Figure 4:
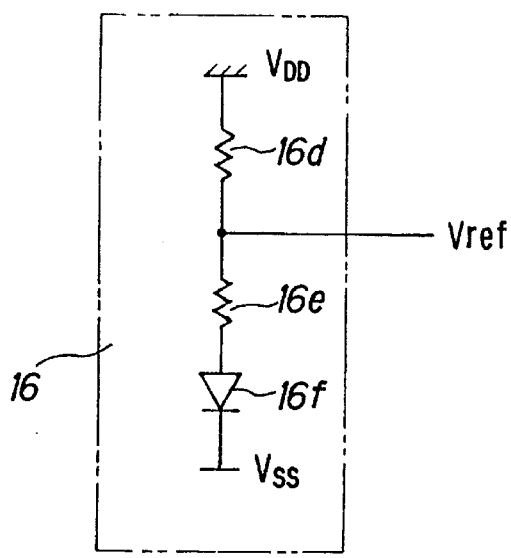
FIG. 4 is a diagram showing an example of an alternative construction of a reference-voltage generator.

FIG. 4 is a diagram showing an alternative construction of the reference-voltage generator 16. Here a voltage-divider circuit is composed of resistors 16d, 16e, and a diode 16f having a negative characteristic with respect to temperature is serially connected to the resistor 16e. The reference-voltage generator 16 is inserted between the power-supply voltage $V_{DD}$ (ground) and $V_{SS}$ (negative polarity). When the temperature rises, the voltage across the terminals of the diode 16f becomes smaller and the reference voltage $V_{ref}$ declines. When the temperature falls, the level of $V_{ref}$ rises.

In an arrangement in which it is necessary to provide a logic circuit as a stage in front of the semiconductor laser drive, the reference voltage $V_{ref}$ is generated so as to compensate for any temperature-induced fluctuation in the waveform (phase) of the data signal DT outputted by this logic circuit, thereby stabilizing the optical power waveform.

(C) Second Embodiment of the Invention (a) Elimination of Bias-Current Adjustment It is possible to eliminate adjustment of bias current and dispense with the bias current by adjusting the reference voltage $V_{ref}$ so as to shift it to a voltage that is less than a voltage $V_{50}$ of duty 50% (see FIGS. 5A, 5B) at the time of adjustment at low temperature. The principle of this operation will now be described.

In order to obtain an excellent transmission characteristic, the optical transmission waveform is required to be an optical power waveform having a large extinction ratio (the ratio of optical power at "1" to optical power at "0") and an excellent eye aperture characteristic. With the ordinary method of driving a semiconductor laser, the bias current $I_B$ is controlled in such a manner that $I_B \approx I_{th}$ is obtained in order to prevent deterioration of the extinction ratio and eye aperture. To accomplish this, it is required that initial setting of the bias current $I_B$ be carried out in dependence upon a variance in the semiconductor laser.

If the reference voltage $V_{ref}$ is initially adjusted to a prescribed voltage (a voltage less than a voltage $V_{50}$ of duty 50%), it is possible to correct for any deterioration in eye aperture resulting from oscillation delay caused by the inequality $I_{th}(T_0) > I_B$ (where $T_0$ represents the adjustment temperature). In other words, in a case where $I_{th}(T_0) > I_B$ holds, adjustment of bias current can be eliminated by initially adjusting the reference voltage $V_{ref}$ to a voltage that is less than $V_{50}$. Further, if the reference voltage is provided with a temperature characteristic, an excellent optical power characteristic can be obtained at all temperatures.

Thus, by designing the circuitry in such a manner that $I_{th}(T_0) > I_B$ will hold, upon taking into consideration a variance in the element characteristic of the threshold-value current $I_{th}$, and initially adjusting the reference voltage $V_{ref}$ to a voltage less than $V_{50}$, and further, by providing the reference voltage with a temperature characteristic, adjustment of the bias current can be eliminated irrespective of element variance. Moreover, an excellent optical output is obtained at all temperatures. In particular, if $I_B = 0$ holds, it is possible to dispense with the bias-current supply unit.

FIG. 5A is a diagram for describing drive current and optical power in a case where an initial setting is made to establish the relation $V_{ref} = V_{50}$ when $I_{th}(T_0) > I_B$ holds, and FIG. 5B is a diagram for describing drive current and optical power in a case where an initial setting is made to establish the relation $V_{ref} < V_{50}$ when $I_{th}(T_0) > I_B$ holds. In the case of FIG. 5A, the optical power waveform is crushed in the phase direction, the extinction ratio is reduced and a stable optical power is not obtained. In the case of FIG. 5B, however, the duty of the optical power waveform is 50%, the extinction ratio is enlarged and a stable optical power is obtained.

(b) Construction of the Second Embodiment

Figure 6:
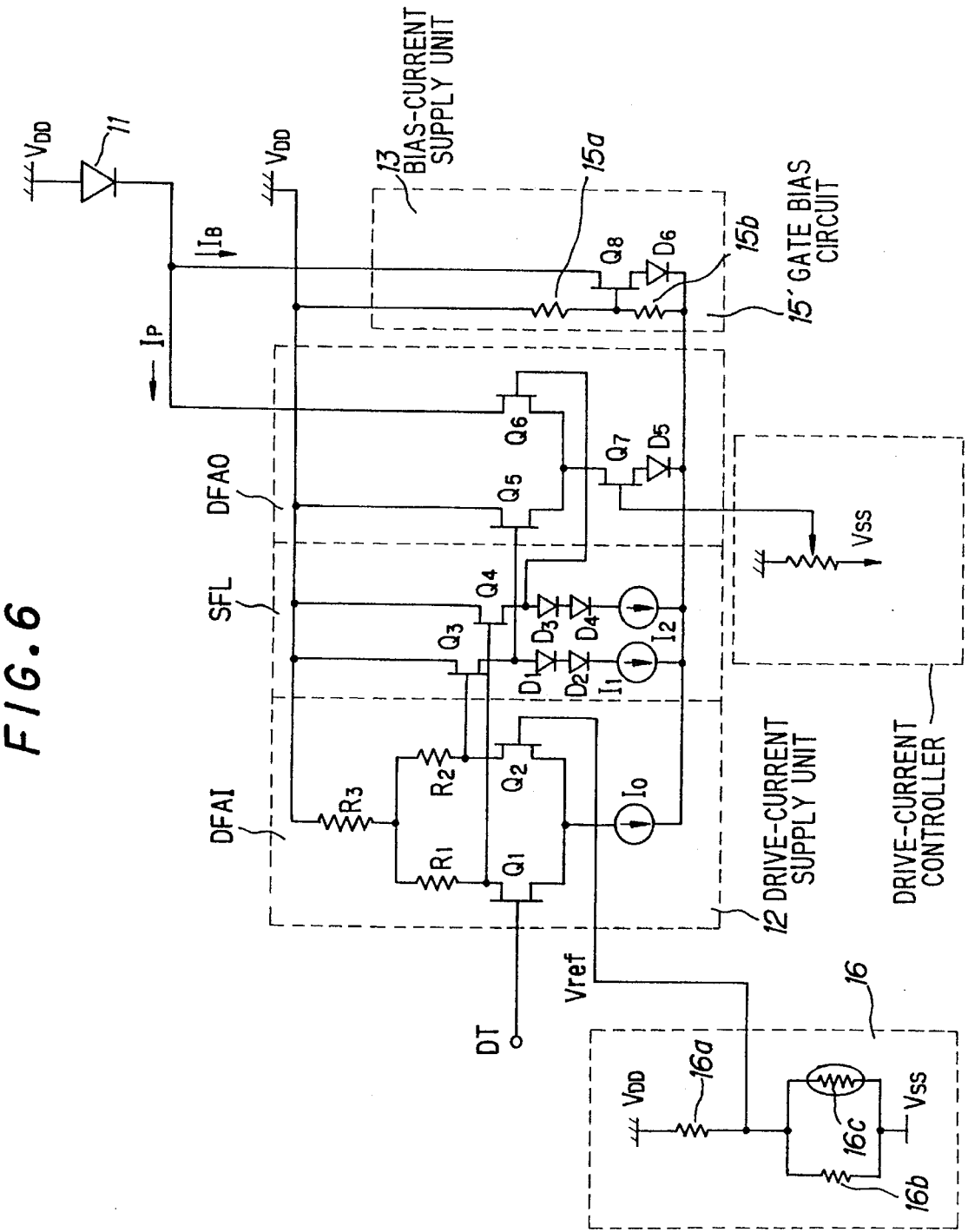
FIG. 6 is a diagram showing the construction of a second embodiment of the present invention (in which adjustment of bias current is eliminated)

FIG. 6 is a diagram showing the construction of an embodiment of the invention for a case in which adjustment of bias current is eliminated. Components identical with those of the first embodiment shown in FIG. 2 are designated by like reference characters. This embodiment differs from the first embodiment in that (1) the bias-current controller 15 is eliminated; (2) a gate biasing circuit 15' is provided to fix the bias current $I_B$ at a constant value; and (3) the reference voltage $V_{ref}$ is initially set to establish the inequality $V_{ref} < V_{50}$. The gate biasing circuit 15' is so constructed that a constant voltage obtained by a voltage dividing operation of resistors 15a, 15b is applied to the gate terminal of the FET Q8 in the bias-current supply unit 13.

In accordance with this semiconductor laser drive, the resistors 15a, 15b of the gate biasing circuit 15' are decided, while taking element variance into account, in such a manner that $I_{th}(T_0) > I_B (\geq 0 \text{ mA})$ will hold, the reference voltage $V_{ref}$ is initially adjusted to a prescribed voltage less than $V_{50}$, and the reference voltage $V_{ref}$ is provided with a temperature characteristic. If this arrangement is adopted, the duty of the optical power waveform can be made about 50% irrespective of element variance. Moreover, the extinction ratio can be enlarged and a stable optical output can be obtained. Further, since adjustment of the bias current is unnecessary, overall adjustment can be performed with ease.

(D) Third Embodiment of the Invention

Figure 7:
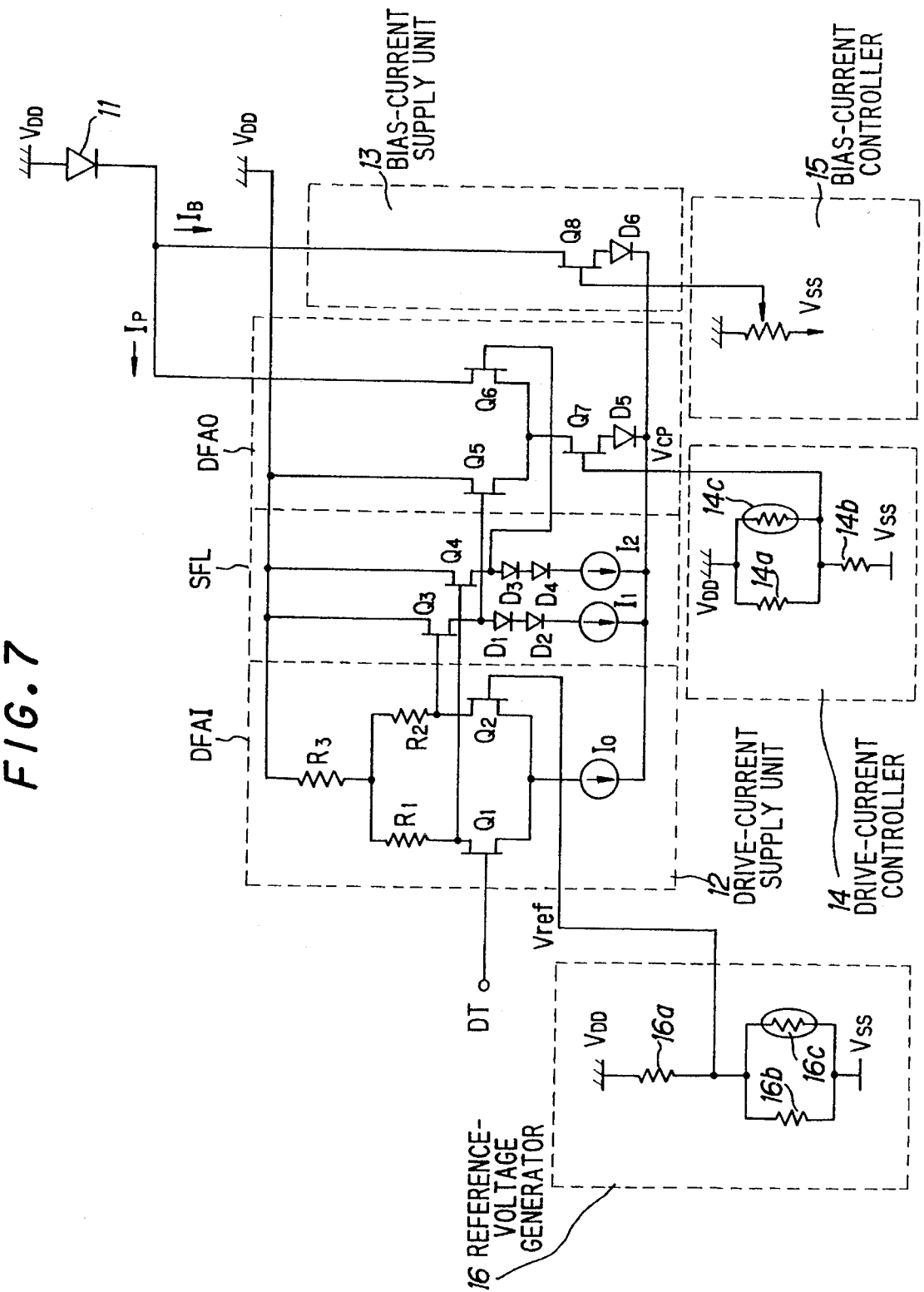
FIG. 7 is a diagram illustrating a third embodiment of the present invention.

FIG. 7 is a diagram showing the construction of an embodiment of the invention. Components identical with those of the first embodiment shown in FIG. 2 are designated by like reference characters. This embodiment differs from the first embodiment in that the drive-current controller 15 is adapted in such a manner that the value of the drive current $I_P$ is increased in dependence upon a rise in temperature. Here the drive-current controller 14 is constituted by a voltage divider circuit composed of resistors 14a, 14b and a temperature-sensitive resistor element (thermister) 14c. Specifically, the resistor 14a and the thermister 14c are connected in parallel, the resistor 14b is connected in series with this parallel circuit and the overall resulting circuitry is inserted between the power-supply voltage $V_{DD}$ (ground) and $V_{SS}$ (negative polarity). The characteristic of the thermister 14c is such that its resistance value decreases with a rise in temperature. When the temperature rises, therefore, the gate voltage (control voltage $V_{cp}$) of the FET Q7 of drive-current supply unit 12 rises, the gate-source voltage $V_{gs}$ of this FET becomes larger and the drive current $I_P$ increases. Conversely, when the temperature falls, the gate-source voltage $V_{gs}$ of the FET Q7 becomes smaller and the drive current $I_P$ decreases.

In accordance with the third embodiment, a decrease in the optical power of the semiconductor laser 11 due to a rise in temperature is compensated for by increasing the drive current $I_P$, the optical power can be made approximately constant and a stabilized optical output is obtained.

If the bias current $I_B$ is set, while taking in consideration a variance in the element characteristic of the threshold-value current $I_{th}$, in such a manner that $I_{th}(T_0) > I_B (\geq 0 \text{ mA})$ will hold, and if the reference voltage $V_{ref}$ is initially adjusted to a voltage less than $V_{50}$ and the reference voltage $V_{ref}$ and drive current $I_P$ are provided with a temperature characteristic, then adjustment of the bias current can be eliminated irrespective of element variance and an excellent optical power is obtained at all temperatures. In this case, the bias-current controller 15 is eliminated and is replaced by the gate biasing circuit 15', just as in the second embodiment. In particular, if $I_B = 0$ holds, it is possible to dispense with the bias-current supply unit.

(E) Fourth Embodiment of the Invention

Figure 8:
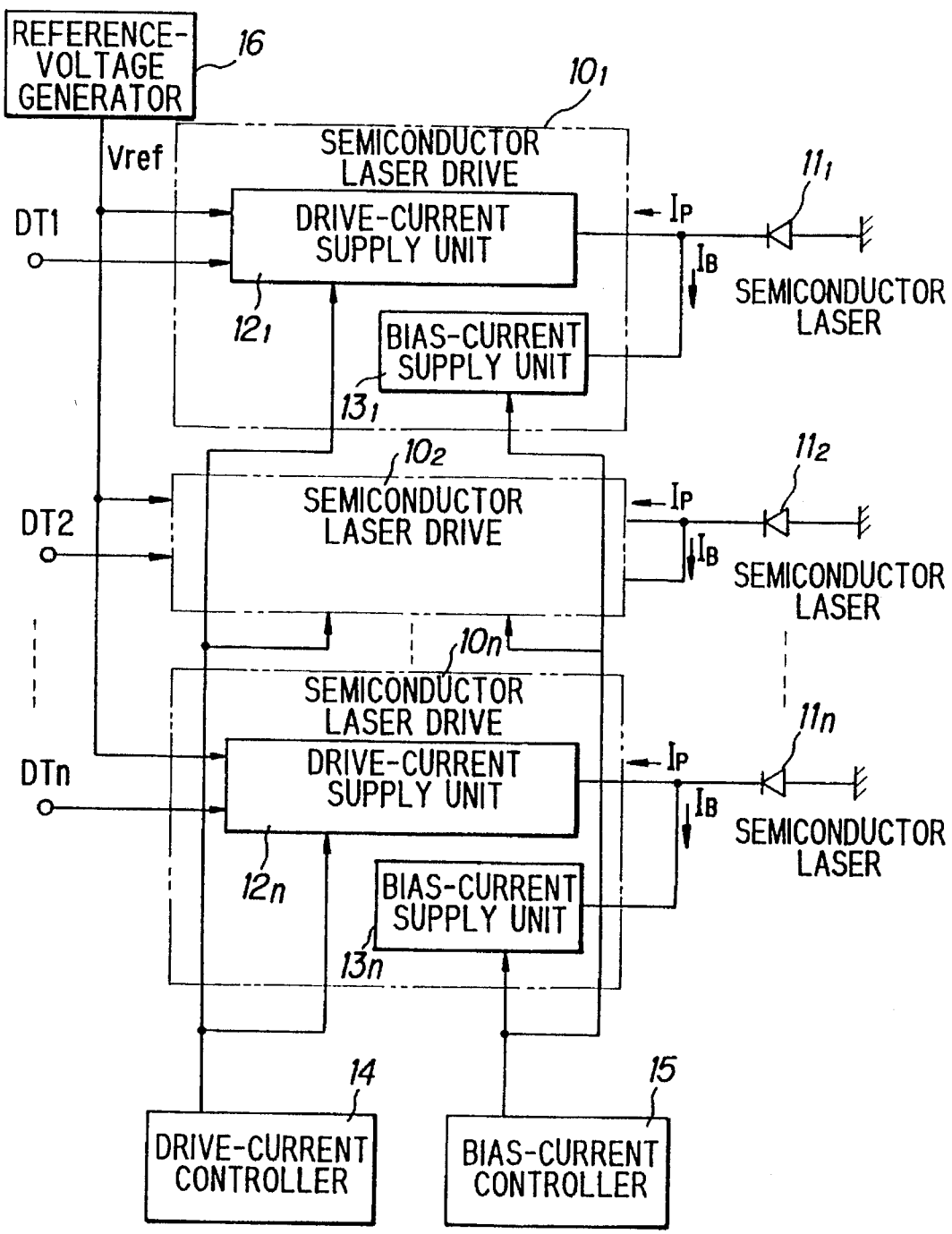
FIG. 8 is a diagram illustrating a fourth embodiment of the present invention.

FIG. 8 is a diagram showing the construction of a fourth embodiment of the present invention. Here a reference-voltage generator, a drive-current controller and a bias-current controller are provided so as to be shared by a plurality of semiconductor laser drives.

Shown in FIG. 8 are semiconductor laser drives $10_1$, $10_2$, ... $10_n$ for driving semiconductor lasers $11_1$, $11_2$, ... $11_n$, respectively, a drive-current controller 14 for increasing the drive current $I_P$ in dependence upon a rise in temperature, the bias-current controller 15 for controlling the bias current $I_B$, and a reference-voltage generator 16 for generating the reference voltage $V_{ref}$ the level of which varies in conformity with temperature. The semiconductor laser drives $10_1$, $10_2$, ... $10_n$ have respective drive-current supply units $12_1$, $12_2$, ... $12_n$ and respective bias-current supply units $13_1$, $13_2$, ... $13_n$. The inputs to the semiconductor laser drives $10_1$, $10_2$, ... $10_n$ are data input signals $DT_1$, $DT_2$, ... $DT_n$, respectively.

Each drive-current supply unit $12i$ (i=1–n), each bias-current supply unit $13i$, the drive-current controller 14, the bias-current controller 15 and the reference-voltage generator 16 have constructions identical with those of the drive-current supply unit, bias-current supply unit, drive-current controller, bias-current controller and reference-voltage generator, respectively, shown in FIG. 7.

One each of the drive-current controller 14, bias-current controller 15 and reference-voltage generator 16 are provided so as to be shared by the semiconductor laser drives $10_1$, $10_2$, ... $10_n$, and the outputs of the controllers 14, 15 and generator 16 are connected in parallel with the requisite portions (the gate terminals of the FETs Q7, Q8, Q2) of each of the semiconductor laser drives $10_1$, $10_2$, ... $10_n$.

At the time of adjustment at low temperature, the bias current $I_B$ is adjusted so as to be smaller than the threshold-value current $I_{th}$ (TO) of all of the semiconductor lasers $11_1$–$11_n$, the reference voltage $V_{ref}$ is adjusted so as to become a prescribed value smaller than the voltage $V_{50}$ of duty 50%, and adjustment is performed in such a manner that the drive current $I_P$ conforming to the desired optical power $P_0$ will flow.

If this arrangement is adopted, a stabilized optical power can be obtained from each of the semiconductor lasers $11_1$–$11_n$. Moreover, with regard to a multiple-channel optical transmitter using a plurality of semiconductor lasers, drive current, bias current and reference voltage can be adjusted collectively at all channels.

(F) Fifth Embodiment of the Invention

Figure 9:
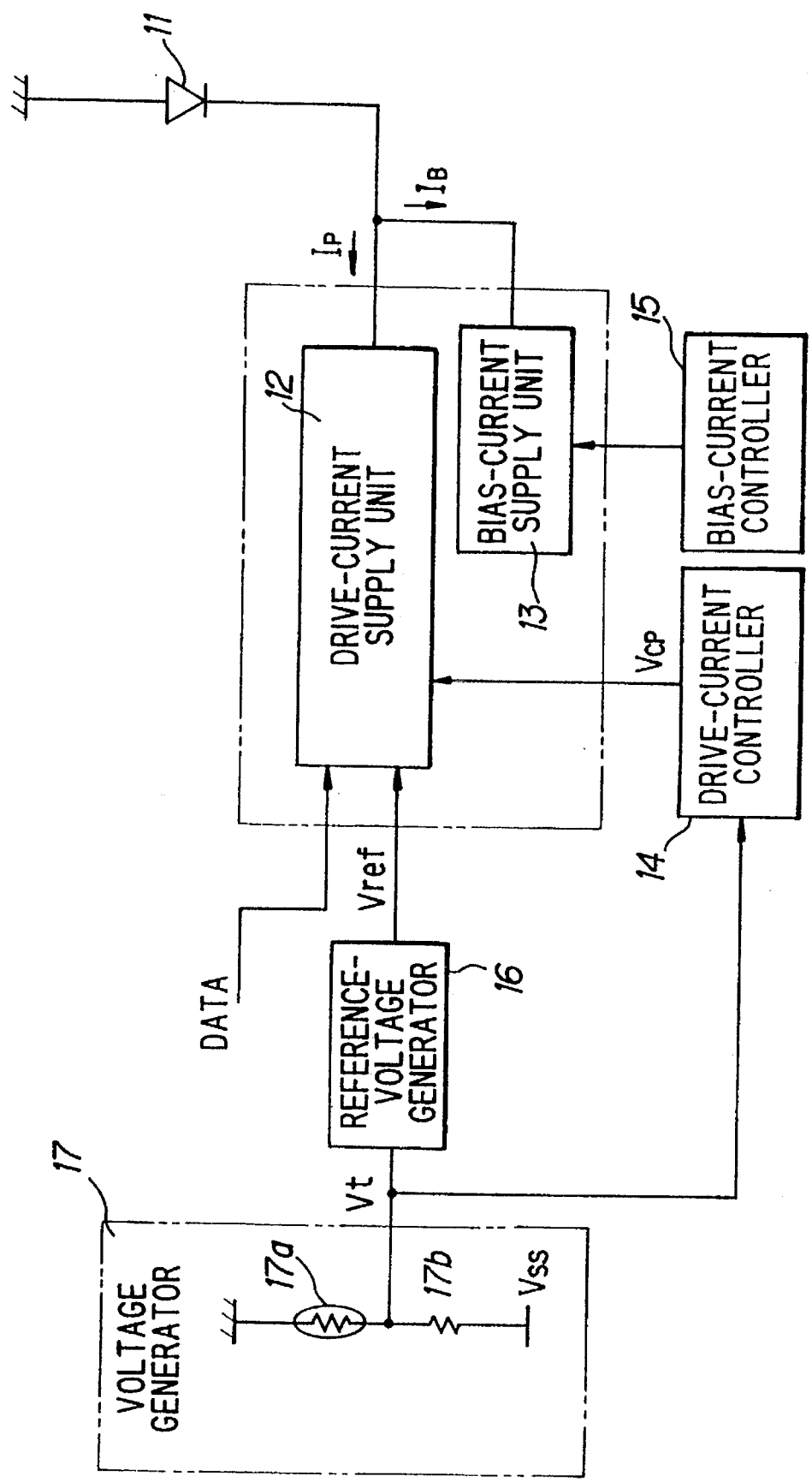
FIG. 9 is a diagram illustrating a fifth embodiment of the present invention.

FIG. 9 is a diagram showing the construction of a fifth embodiment of the present invention. This is an example in which a reference voltage $V_{ref}$ and a drive-current control voltage $V_{cp}$ that conform to temperature are generated using a single shared temperature-sensitive variable resistor element (thermister). In the third embodiment of FIG. 7, the drive-current controller 14 and reference-voltage generator 16 output the drive-current control voltage $V_{cp}$ and reference voltage $V_{ref}$ using the thermisters 14c, 16c independently. However, the fewer the number of thermisters, the better. Accordingly, in the fifth embodiment, a voltage generator 17 for generating a voltage $V_t$ conforming to temperature is provided. On the basis of the voltage $V_t$, the drive-current controller 14 generates the drive-current control voltage $V_{cp}$, which increases in conformity with a rise in temperature. Further, on the basis of the voltage $V_t$, the reference-voltage generator 16 generates the reference voltage $V_{ref}$, which declines in conformity with a rise in temperature.

The voltage generator 17 is composed of a voltage divider circuit having a thermister 17a and a resistor 17b connected in series, with the voltage at the junction of the thermister 17a and resistor 17b being applied to the drive-current controller 14 and reference-voltage generator 16 as $V_t$. The drive-current supply unit 12 and the bias-current supply unit 13 have constructions identical with those of the third embodiment.

(G) Sixth Embodiment of the Invention

Figure 10:
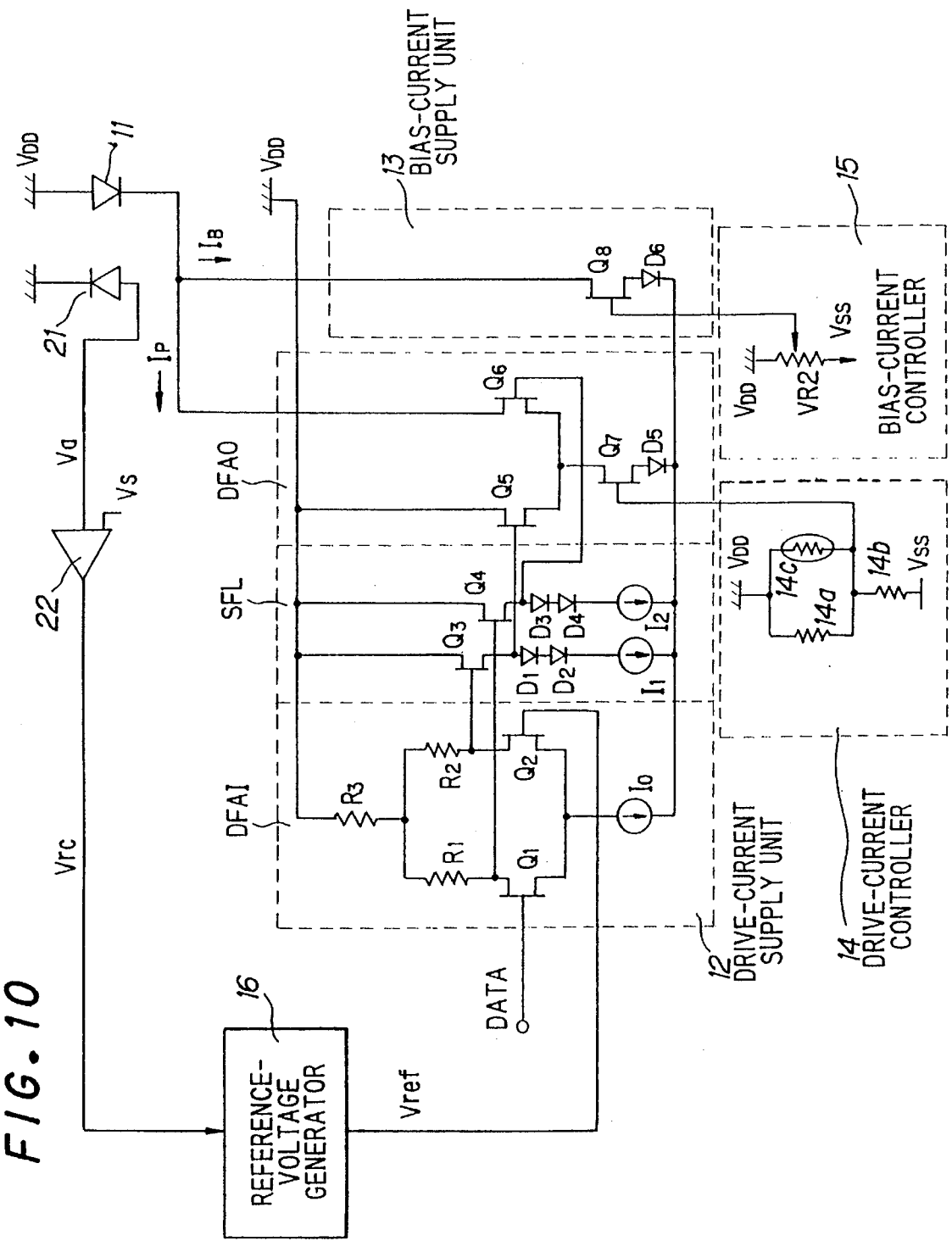
FIG. 10 is a diagram illustrating a sixth embodiment of the present invention.

In the foregoing the reference-voltage generator 16 generates the reference voltage $V_{ref}$, which conforms to temperature, by using a temperature-sensitive variable resistor element (thermister). However, an arrangement can be adopted in which optical power is detected and the reference voltage generated on the basis of the detected optical power. FIG. 10 shows the construction of such an embodiment, namely a sixth embodiment of the invention. Components identical with those of the third embodiment shown in FIG. 7 are designated by like reference characters.

This embodiment differs from the third embodiment in that (1) there is provided a light-receiving element 21 for detecting part of the optical output of the semiconductor laser 11 as average power of the optical output; (2) a signal outputted by the light-receiving element 21 is compared with a set level by means of a comparing amplifier 22 and a reference-voltage control signal $V_{rd}$ conforming to the difference between the signal and the set level is outputted by the comparing amplifier; and (3) the reference-voltage generator 16 outputs the reference voltage $V_{ref}$, which has a prescribed level depending upon the reference-voltage control signal $V_{rc}$.

A set voltage $V_s$ conforming to a desired optical output is applied to one input terminal of the comparing amplifier 22 in advance. The comparing amplifier 22 compares the average signal $V_a$ of actual optical output with the set voltage $V_s$ and outputs the reference-voltage control signal $V_{rs}$ conforming to the difference between the two signals compared. In a case where the actual value $V_a$ is larger than the set voltage $V_s$, the reference-voltage generator 16 performs control in conformity with the difference in such a manner that the reference voltage $V_{ref}$ increases. In a case where the actual value $V_a$ is smaller than the set voltage $V_s$, the reference-voltage generator 16 performs control in conformity with the difference in such a manner that the reference voltage $V_{ref}$ decreases. A stabilized optical power is obtained as a result.

(H) First Embodiment of Constant-Current Circuit

In the above-described semiconductor laser drive, the bias-current supply unit 13 and bias-current controller 15 construct a constant-current circuit overall. In other words, the bias-current supply unit 13, which supplies the semiconductor laser with the bias current, and the bias-current controller 14 can be substituted by a constant-current circuit.

Figure 11:
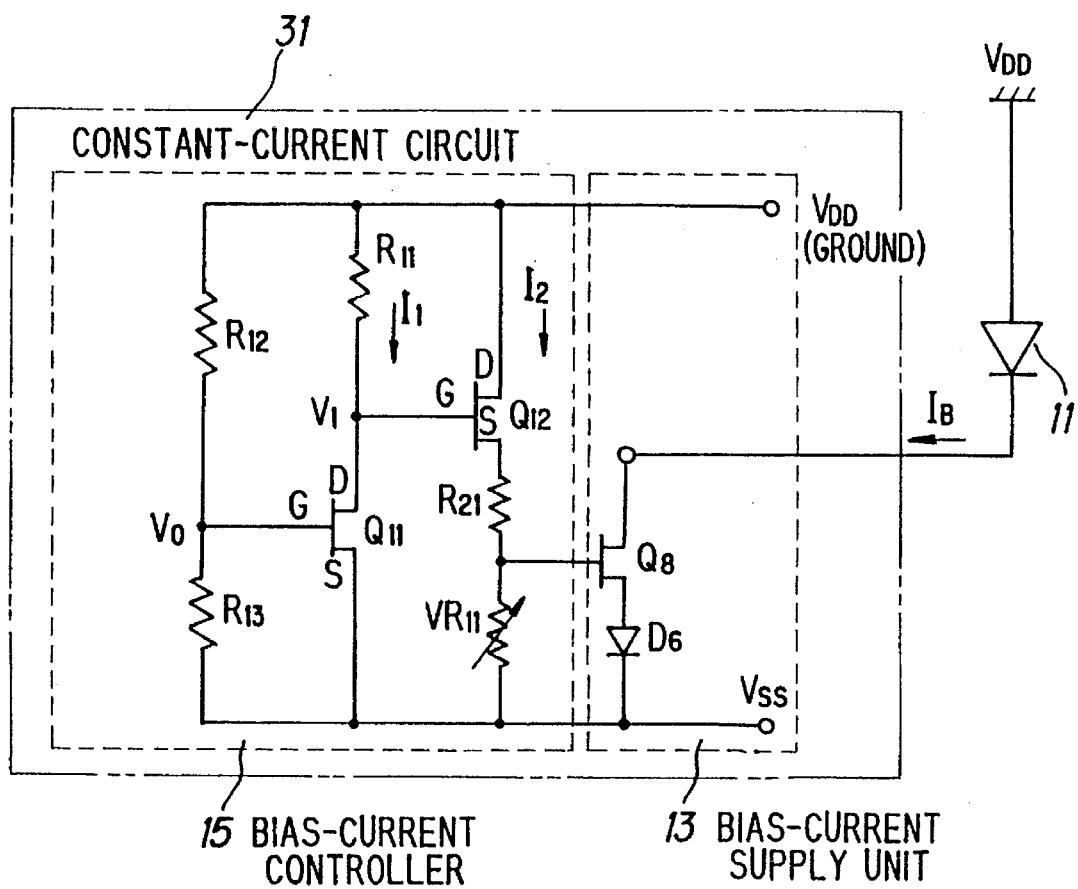
FIG. 11 is a diagram showing the construction of a first embodiment (relating to bias current) of a constant-current circuit.

FIG. 11 is a diagram showing the construction of a constant-current circuit for rendering drain current constant with respect to a fluctuation in power-supply voltage. This is an example in which the constan-current circuit is applied to the bias-current supply unit 13 and bias-current controller 15 of the semiconductor laser drive. In FIG. 11, numeral 31 denotes the constant-current circuit and numerals 11, 13 and 15 designate the semiconductor laser, the bias-current supply unit and the bias-current controller, respectively.

The bias-current supply unit 13 is constituted by a series circuit composed of the FET Q8 and diode D6, and the semiconductor laser 11 is connected to the drain terminal of the FET Q8.

The bias-current controller 15 has first and second field-effect transistors (FETs) $Q_{11}$, $Q_{12}$, resistors $R_{11}$, $R_{12}$, $R_{13}$, $R_{21}$ and a variable resistor $VR_{11}$. The drain of the first FET $Q_{11}$ is connected to a first power supply $V_{DD}$ (ground) via the first resistor $R_{11}$, and the source terminal of this FET is connected to a second power , supply $V_{SS}$ (negative polarity). A voltage divider circuit constructed by the resistors $R_{12}$, $R_{13}$ voltage-divides the voltage across the first and second power supplies and applies the divided voltage to the gate terminal of the first FET $Q_{11}$. The drain terminal of the second FET $Q_{12}$ is connected to the first power supply $V_{DD}$, the gate terminal is connected to the drain of the first FET $Q_{11}$, and the source is connected to a second power supply $V_{SS}$ via a series circuit composed of the second resistor $R_{21}$ and variable resistor $VR_{11}$. The junction of the second resistor $R_{21}$ and variable resistor $VR_{11}$ is connected to the gate terminal of the FET Q8 of the bias-current supply unit 13, whereby the gate voltage is supplied to the FET Q8.

The constant-current circuit 31 is so adapted that the bias current $I_B$ can be rendered approximately constant even if the power-supply voltage fluctuates. In general, the drain current of a FET is expressed by the following equation:

$$I_D \propto \beta(V_{gs} - V_{th})^2 \qquad (2)$$

Accordingly, in order to arrange it so that the bias current $I_B$, which is the drain current of the FET Q8, will not change with respect to a fluctuation in voltage, it is required that the gate-source voltage $V_{gs}$ of the FET Q8 in the constant-current circuit of FIG. 11 be rendered constant, i.e., that a current $I_2$ which flows into the variable resistor $RV_{11}$ be rendered constant. If the power-supply voltage ($V_{DD}-V_{SS}$) increases, the current $I_1$ increases. If the first resistor $R_{11}$ is selected at this time so that ($V_1-V_{SS}$) is rendered substantially constant, the gate-source voltage $V_{gs}$ of the second FET $Q_{12}$ will not change and the constant current $I_2$ will be obtained in accordance with Equation (2). As a result, the bias current $I_B$ is rendered constant even if the power-supply voltage fluctuates.

When it is desired to adjust the bias current $I_B$, this is done by adjusting the value of the variable resistor $VR_{11}$. If the resistance value of the variable resistor $VR_{11}$ is changed, the gate-source voltage $V_{gs}$ of the FET Q8 changes and so does the bias current $I_B$. Accordingly, an initial setting of the bias current $I_B$ made to conform to the characteristic of the semiconductor laser 11 can be performed by the variable resistor $VR_{11}$. At this time the potential $V_1$ is decided by the FET $Q_{11}$ and resistors $R_{11}$–$R_{13}$, and therefore the bias current will not change even if a change is made by adjustment of the variable resistor $VR_{11}$. Accordingly, the bias current is controlled so as to be fixed with respect to a fluctuation in the power supply even when the value of bias current is altered.

Figure 12:
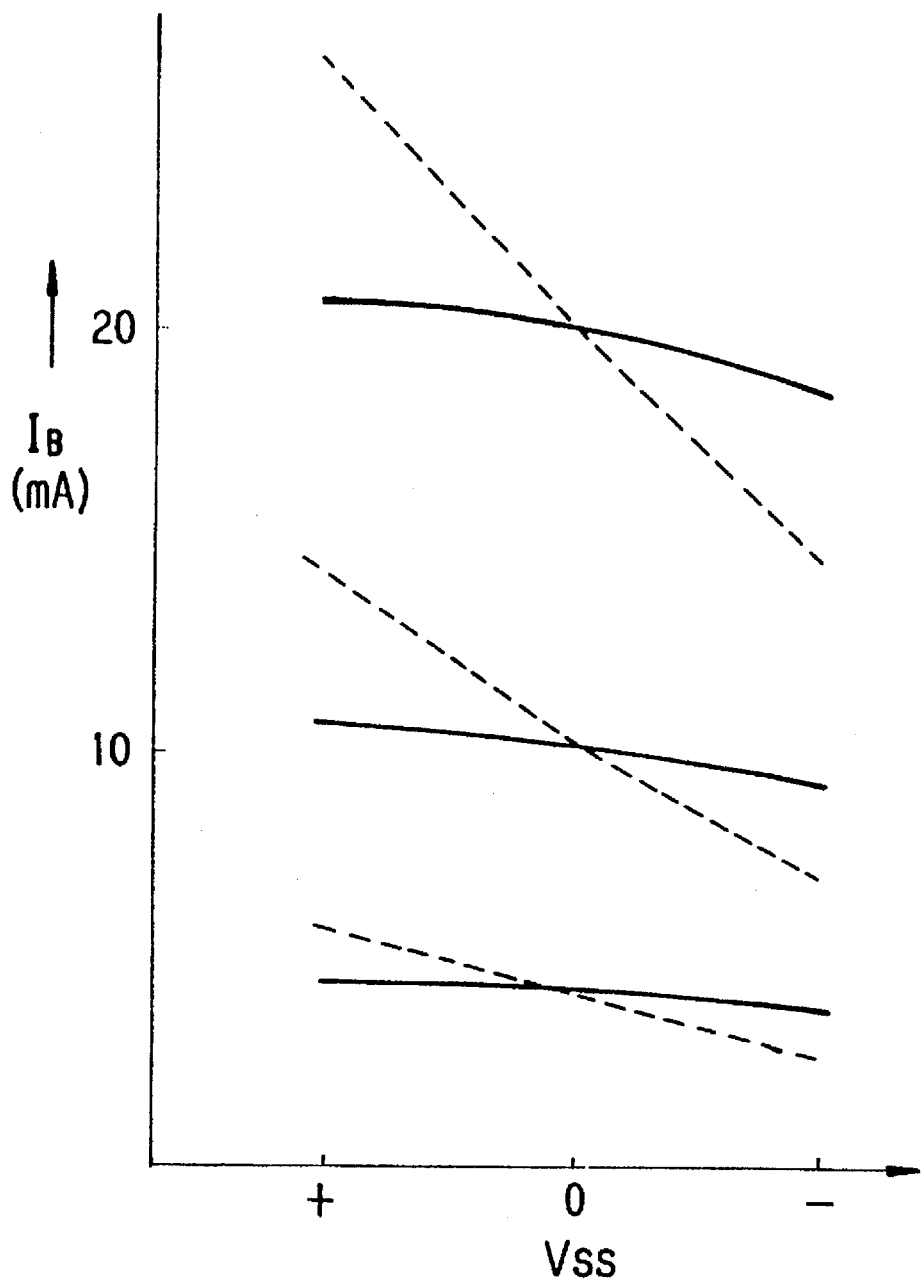
FIG. 12 is a diagram showing a characteristic of power-supply fluctuation vs. bias current according to the present invention.
Figure 25:
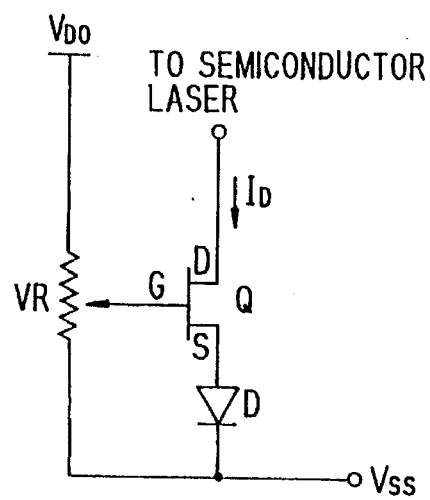
FIG. 25 is a diagram showing the construction of a constant-current circuit according to the prior art.
Figure 26:
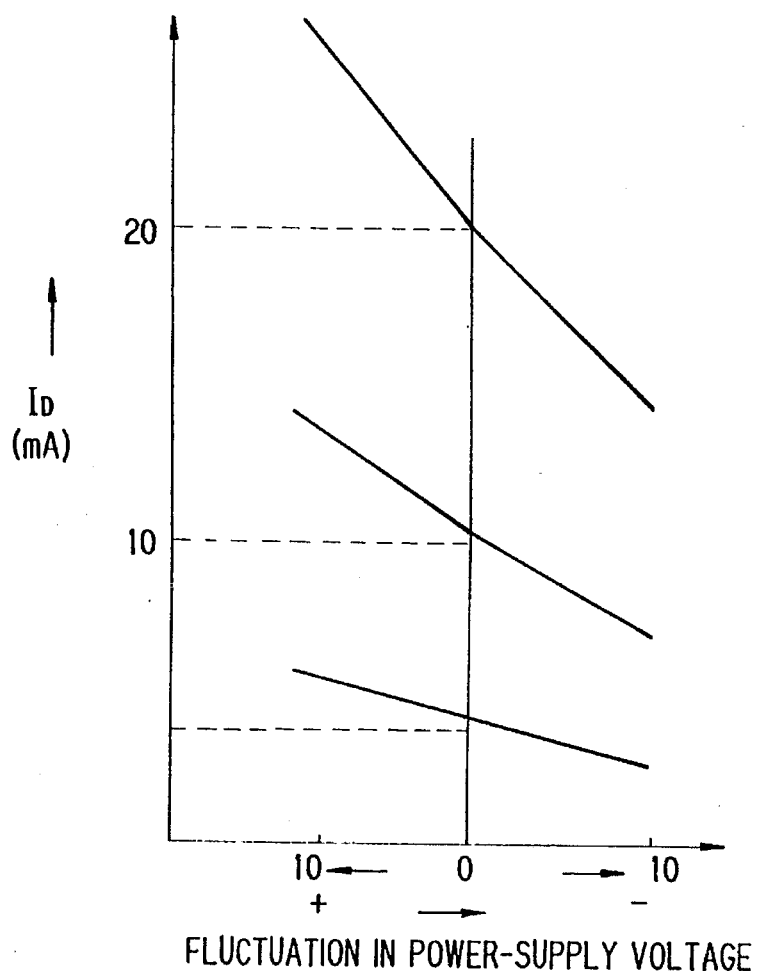
FIG. 26 is a diagram showing a characteristic of a fluctuation in power-supply voltage vs. drain current in a constant-current circuit according to the prior art.

FIG. 12 is a measurement diagram showing fluctuation of bias current $I_B$ with respect to a fluctuation in power supply (±10%). This is for a case in which the bias current $I_B$ is 20 mA, 10 mA and 5 mA at a power supply fluctuation of 0%. The solid lines are the characteristics of the constant-current circuit of FIG. 11, and the dashed lines are the characteristics of the constant-current circuit of FIG. 25. It will be understood that in accordance with the constant-current circuit of the present invention, a change in current with respect to a fluctuation in the power supply will be small regardless of the bias current.

(I) Second Embodiment of Constant-Current Circuit

In the semiconductor laser drive, part of the circuitry of the drive-current supply unit 12 (see FIG. 2) and the bias-current controller 15 construct a constant-current circuit overall. In other words, part of the drive-current supply unit 12, which supplies the semiconductor laser with the drive current, and the drive-current controller 14 can be substituted by a constant-current circuit.

Figure 13:
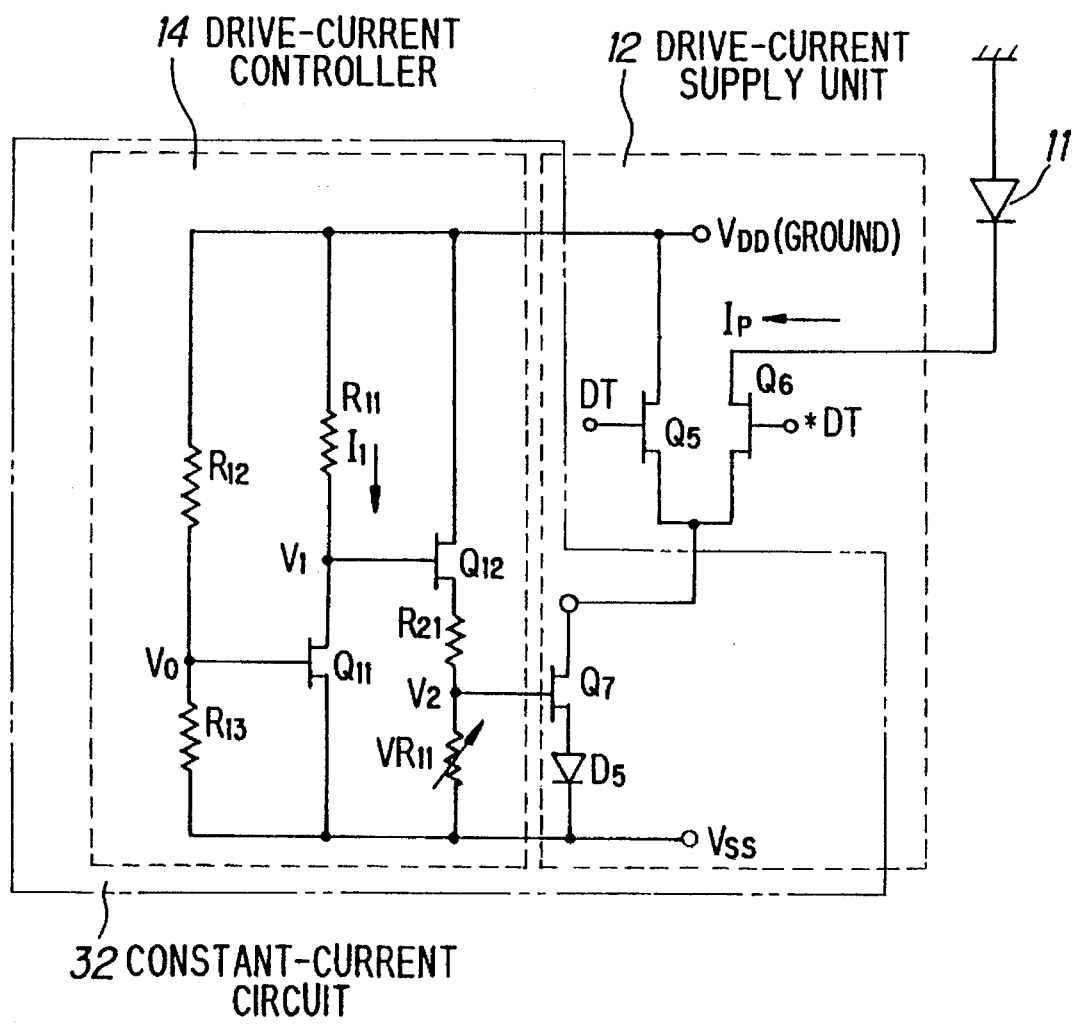
FIG. 13 is a diagram showing the construction of a second embodiment (relating to drive current) of a constant-current circuit.

FIG. 13 is a diagram showing the construction of a constant-current circuit for rendering drain current constant with respect to a fluctuation in power-supply voltage. This is an example in which the constant-current circuit is applied to part of the drive-current supply unit 12 and the drive-current controller 14 of the semiconductor laser drive. In FIG. 13, numeral 32 denotes the constant-current circuit and numerals 11, 12 and 14 designate the semiconductor laser, the drive-current supply unit (only a part of which is shown) and the drive-current controller, respectively.

The drive-current supply unit 12 has the construction shown in FIG. 2. In FIG. 13, only the portion related to the current path of the drive current $I_P$ is shown. The drive-current controller 14 has a construction identical with that of the bias-current controller 15 shown in FIG. 11. This exercises control in such a manner that the drive current $I_P$ is rendered constant even if a fluctuation in voltage occurs.

(J) Third Embodiment of Constant-Current Circuit

Figure 23:
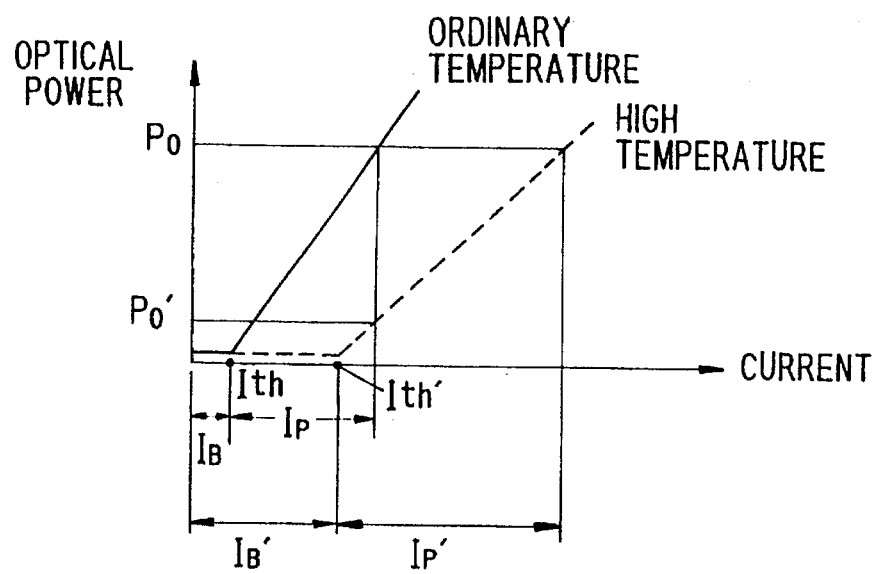
FIG. 23 is a diagram showing a temperature characteristic of optical power vs. current.
Figure 24:
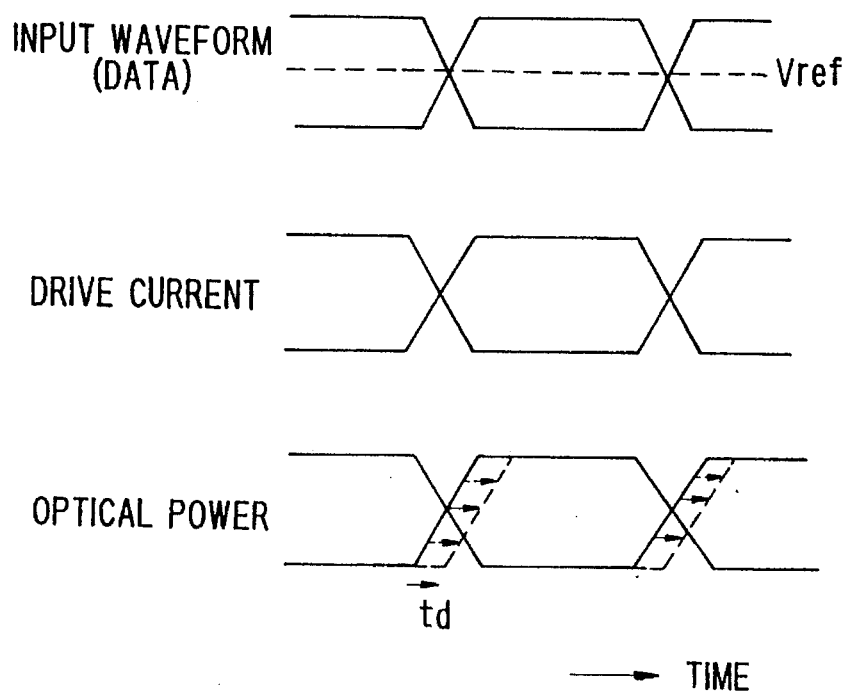
FIG. 24 is a diagram for describing oscillation delay of optical power according to the prior art.

Since the semiconductor laser 11 has the temperature characteristic shown in FIG. 23, it is preferred that the bias current $I_B$ be set to be equal to the threshold-value current $I_{th}$ in order to obtain optical power that is free of any deterioration. To accomplish this, it is required that the bias current have a positive temperature characteristic.

Figure 14:
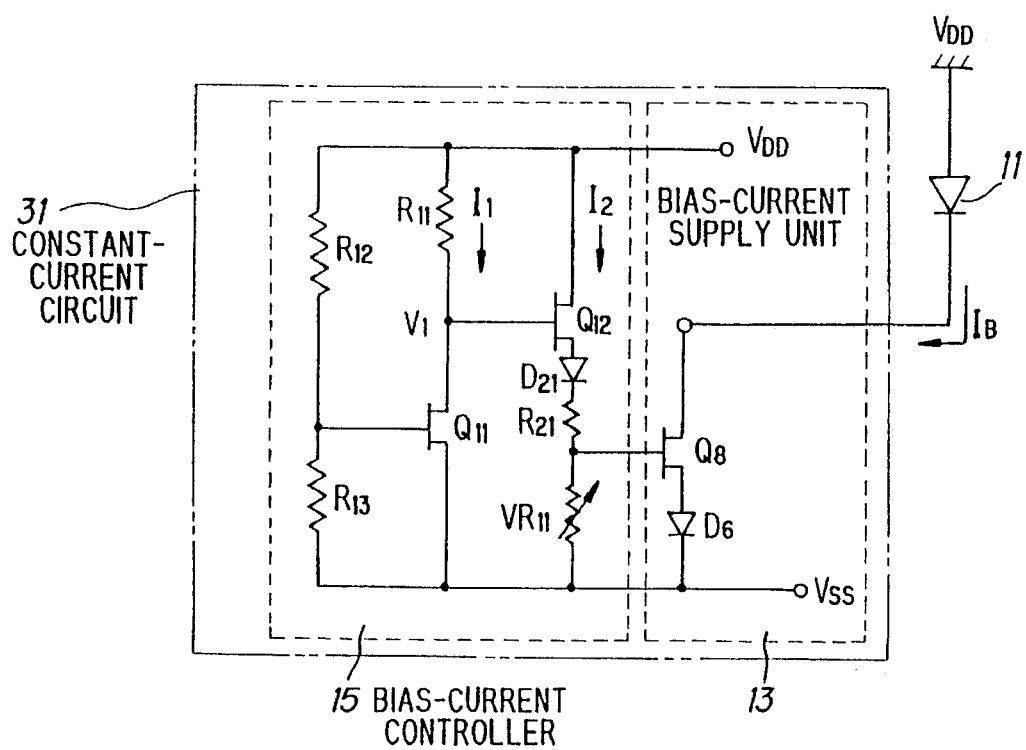
FIG. 14 is a diagram showing the construction of a third embodiment (relating to use of a diode) of a constant-current circuit.
Figure 15:
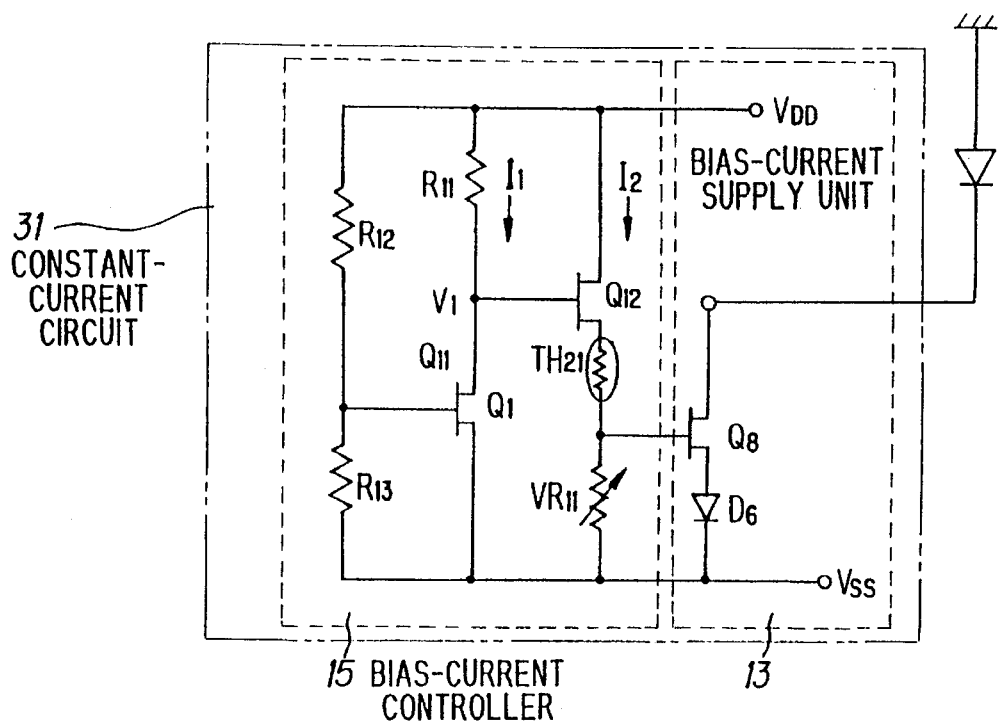
FIG. 15 is a diagram showing the construction of a third embodiment (relating to use of a thermister) of a constant-current circuit.

FIGS. 14 and 15 are diagrams illustrating the construction of constant-current circuits according to the present invention, in which the bias current $I_B$ is provided with a positive temperature characteristic. Components identical with those of the constant-current circuit of FIG. 11 are designated by like reference characters. The same circuit arrangement can be used also in a case where the drive current $I_P$ is provided with a positive temperature characteristic.

The constant-current circuit of FIG. 14 differs from that of FIG. 11 in that a diode $D_{21}$ having a negative characteristic with respect to temperature is inserted at the second resistor $R_{21}$. When the temperature rises, the terminal voltage of the diode $D_{21}$ decreases. Consequently, the gate voltage of the FET $Q_8$ rises, the gate-source voltage $V_{gs}$ increases and so does the bias current $I_B$. As a result, even if the threshold-value current $I_{th}$ of the semiconductor laser 11 increases owing to a rise in temperature, the bias current $I_B$ also rises and the relation $I_B \approx I_{th}$ is established.

The constant-current circuit of FIG. 15 differs from that of FIG. 11 in that the second resistor $R_{21}$ is replaced by a thermister $TH_{21}$. When the temperature rises, the resistance of the thermister $TH_{21}$ decreases. Consequently, the gate voltage of the FET $Q_8$ rises, the gate-source voltage $V_{gs}$ increases and so does the bias current $I_B$. As a result, even if the threshold-value current $I_{th}$ of the semiconductor laser 11 increases owing to a rise in temperature, the bias current $I_B$ also rises and the relation $I_B \approx I_{th}$ is established.

(K) Fourth Embodiment of Constant-Current Circuit

Figure 16:
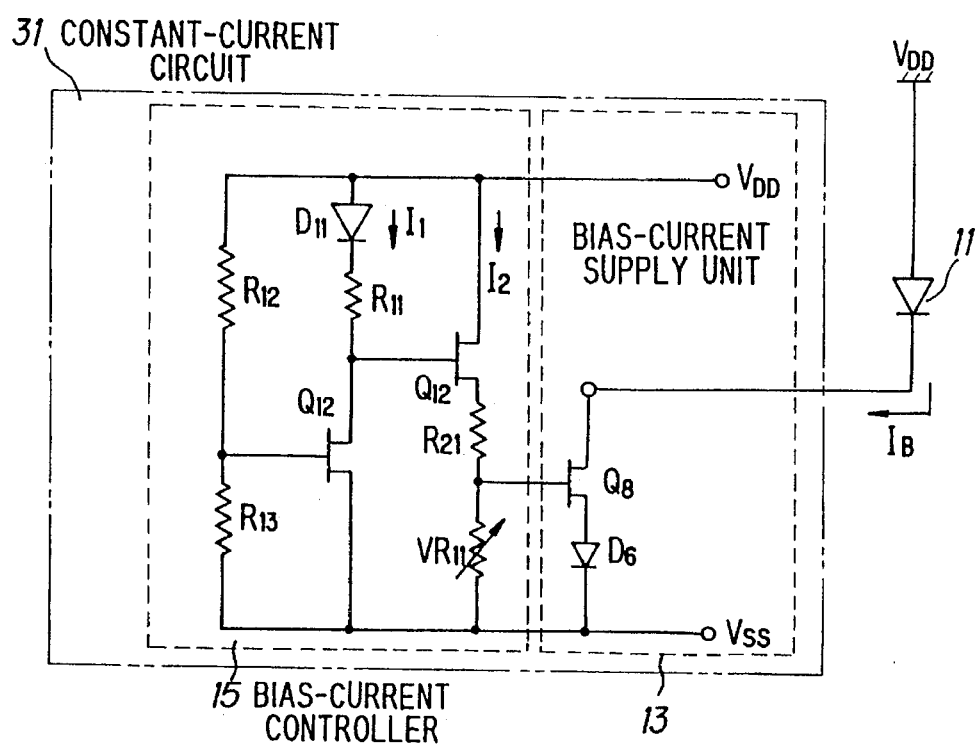
FIG. 16 is a diagram showing the construction of a fourth embodiment (relating to use of a diode) of a constant-current circuit.
Figure 17:
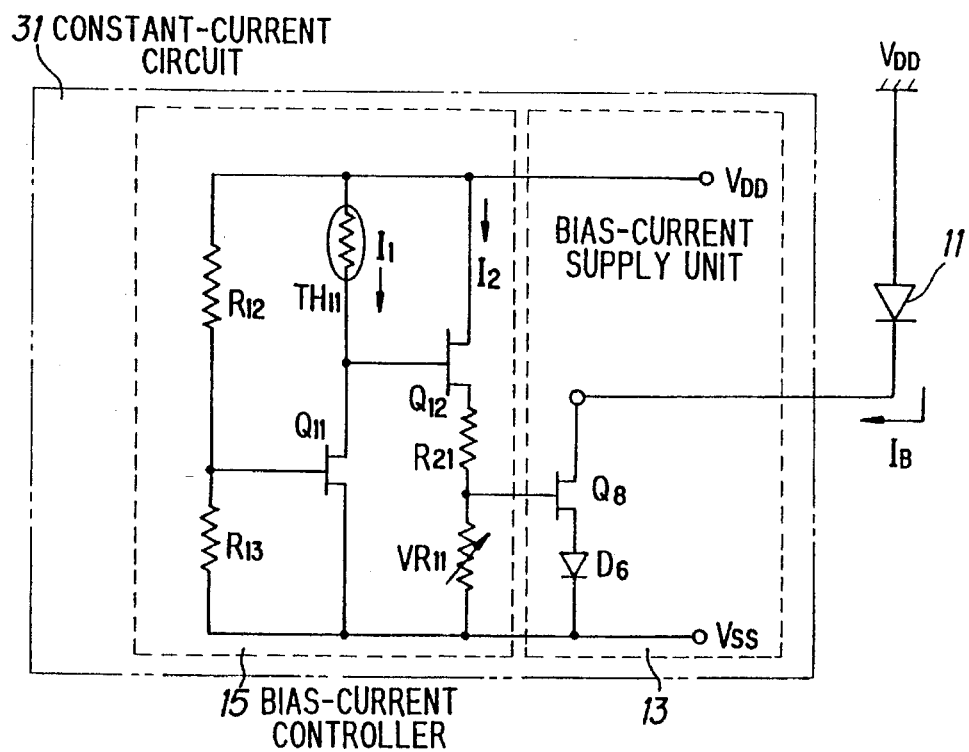
FIG. 17 is a diagram showing the construction of a fourth embodiment (relating to use of a thermister) of a constant-current circuit.

FIGS. 16 and 17 are diagrams illustrating the construction of constant-current circuits according to the present invention, in which the bias current $I_B$ is provided with a positive temperature characteristic. Components identical with those of the constant-current circuit of FIG. 11 are designated by like reference characters. The same circuit arrangement can be used also in a case where the drive current $I_P$ is provided with a positive temperature characteristic.

The constant-current circuit of FIG. 16 differs from that of FIG. 11 in that a diode $D_{11}$ having a negative characteristic with respect to temperature is inserted at the first resistor $R_{11}$. When the temperature rises, the terminal voltage of the diode $D_{11}$ decreases. Consequently, the gate voltage of the FET $Q_{12}$ rises and the current $I_2$ increases. As a result, the gate voltage of the FET $Q_8$ increases, the gate-source voltage $V_{gs}$ becomes larger and so does the bias current $I_B$. Accordingly, even if the threshold-value current $I_{th}$ of the semiconductor laser 11 increases owing to a rise in temperature, the bias current $I_B$ also rises and the relation $I_B \approx I_{th}$ is established.

The constant-current circuit of FIG. 17 differs from that of FIG. 11 in that the first resistor $R_{11}$ is replaced by a thermister $TH_{11}$. When the temperature rises, the resistance of the thermister $TH_{11}$ decreases. Consequently, the gate voltage of the FET $Q_{12}$ rises and the current $I_2$ increases. As a result, the gate voltage of the FET $Q_8$ increases, the gate-source voltage $V_{gs}$ becomes larger and so does the bias current $I_B$. Accordingly, even if the threshold-value current $I_{th}$ of the semiconductor laser 11 increases owing to a rise in temperature, the bias current $I_B$ also rises and the relation $I_B \approx I_{th}$ is established.

Figure 18:
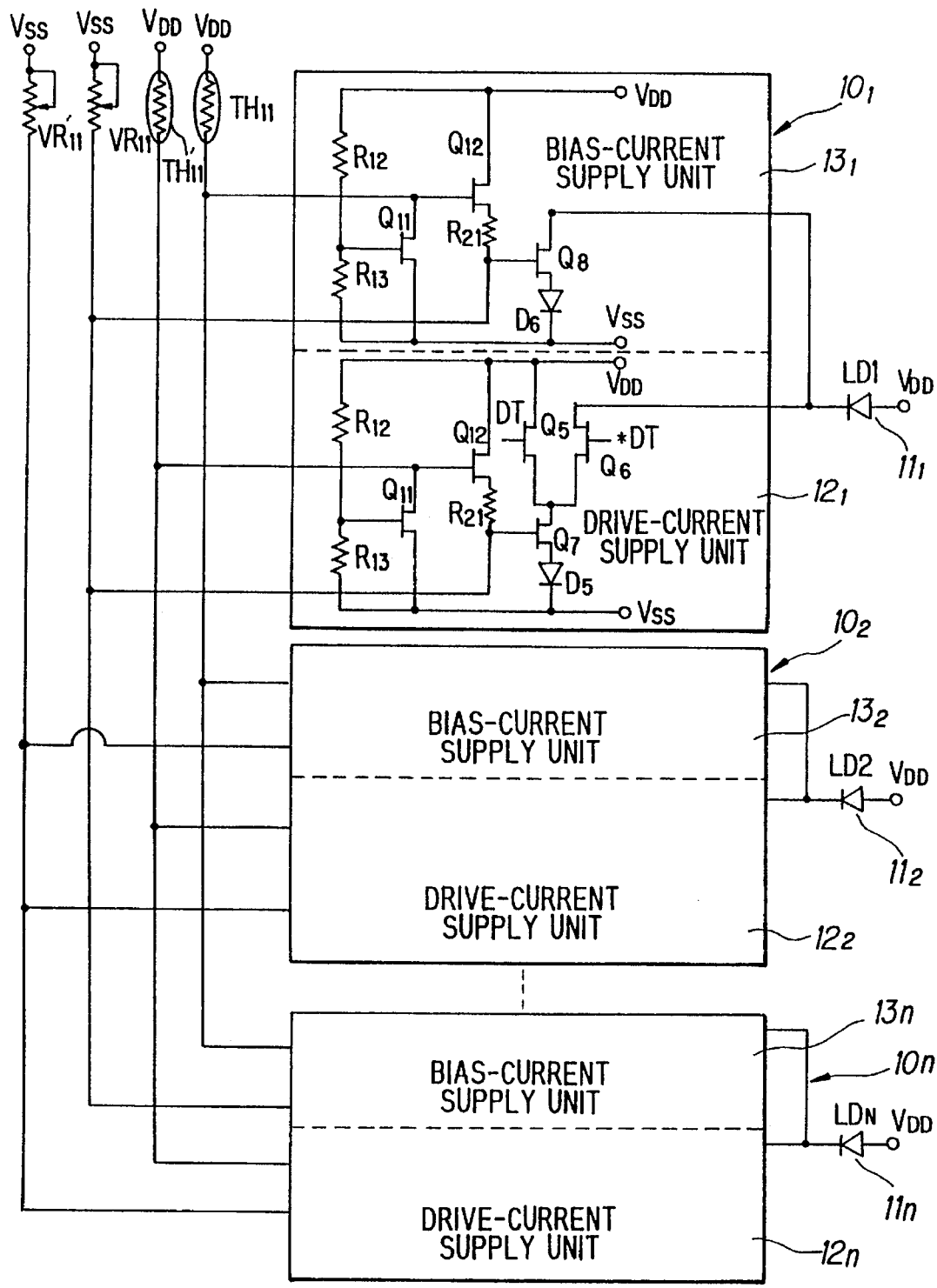
FIG. 18 is a diagram showing the construction of an optical transmission module for transmitting data on a plurality of channels.

(L) Application to Optical Transmission Module for Transmitting Multiple-Channel Data FIG. 18 is a diagram showing the construction of an optical transmission module for transmitting data on a plurality of channels. Shown in FIG. 18 are a plurality of semiconductor laser drives $10_1, 10_2, \ldots 10_n$ for driving a plurality of semiconductor lasers $11_1, 11_2, \ldots 11_n$, respectively, a drive-current controller 14 for increasing the drive current $I_P$ in dependence upon a rise in temperature, drive-current supply units $12_1, 12_2, \ldots 12_n$ each constituted by the constant-current circuit shown in FIG. 17, bias-current supply units $13_1, 13_2, \ldots 13_n$ each constituted by the constant-current circuit shown in FIG. 17, the bias-current adjusting variable resistor $VR_{11}$ provided so as to be shared by each of the semiconductor laser drives, a drive-current adjusting variable resistor $VR_{11}'$ provided so as to be shared by each of the semiconductor laser drives, the thermister $TH_{11}$, which applies a temperature compensation for bias current, provided so as to be shared by each of the semiconductor laser drives, and a thermister $TH_{11}'$, which applies a temperature compensation for drive current, provided so as to be shared by each of the semiconductor laser drives.

The variable resistors $VR_{11}$, $VR_{11}'$ and the thermisters $TH_{11}$, $TH_{11}'$ are provided so as to be shared by the semiconductor laser drives $10_1$, $10_2$, ... $10_n$ and are externally fitted on the semiconductor laser drives. With the arrangement of FIG. 18, the externally fitted components (the variable resistors $VR_{11}$, $VR_{11}'$ and thermisters $TH_{11}$, $TH_{11}'$) can be shared by all channels so that it is possible to provide a parallel-transmission optical transmission module capable of transmitting data on a plurality of channels simultaneously. The transmission module has only a small amount of circuitry and only a few points requiring adjustment.

Figure 19:
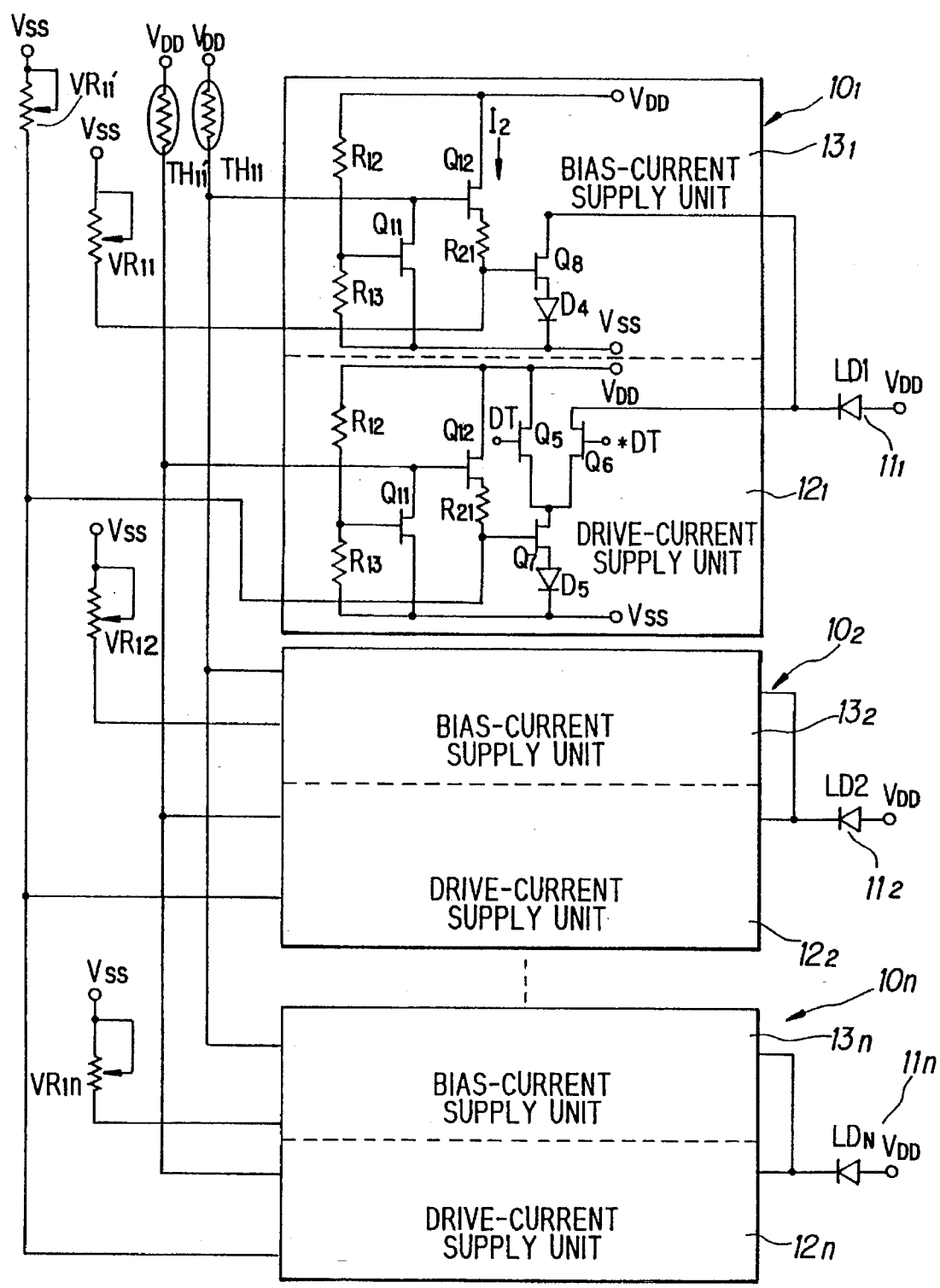
FIG. 19 is a diagram showing the construction of an optical transmission module (for separate adjustment of bias current) for transmitting data on a plurality of channels.
Figure 20:
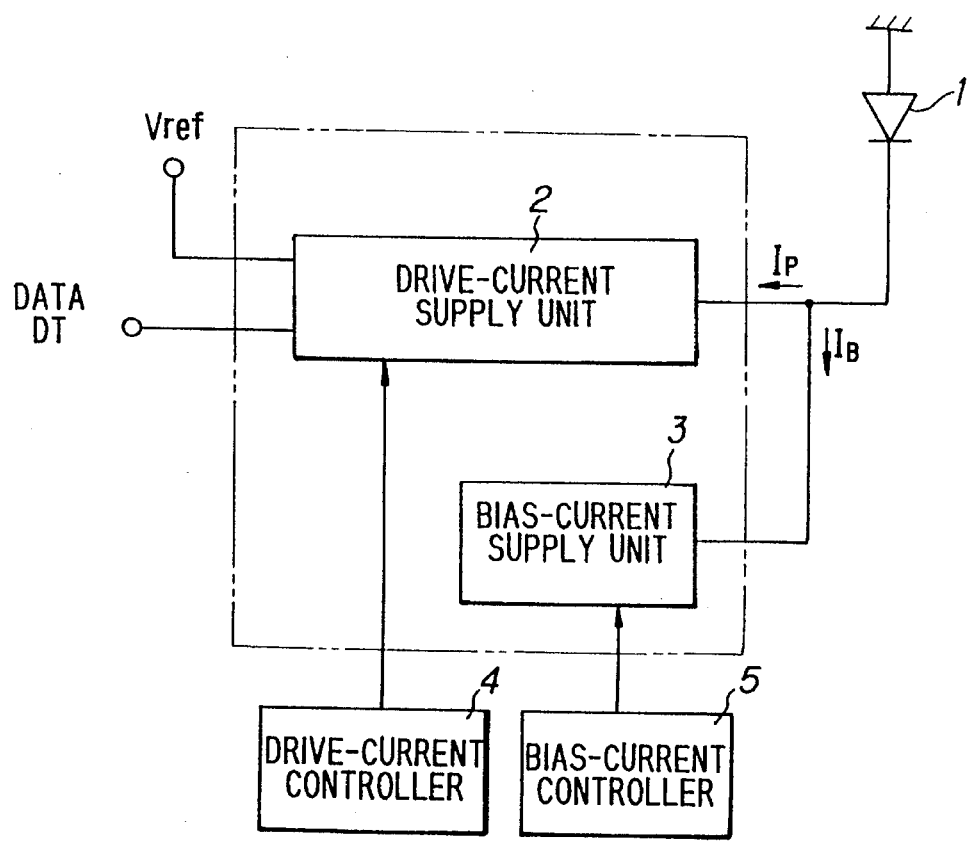
FIG. 20 is a block diagram showing a semiconductor laser drive according to the prior art.
Figure 21:
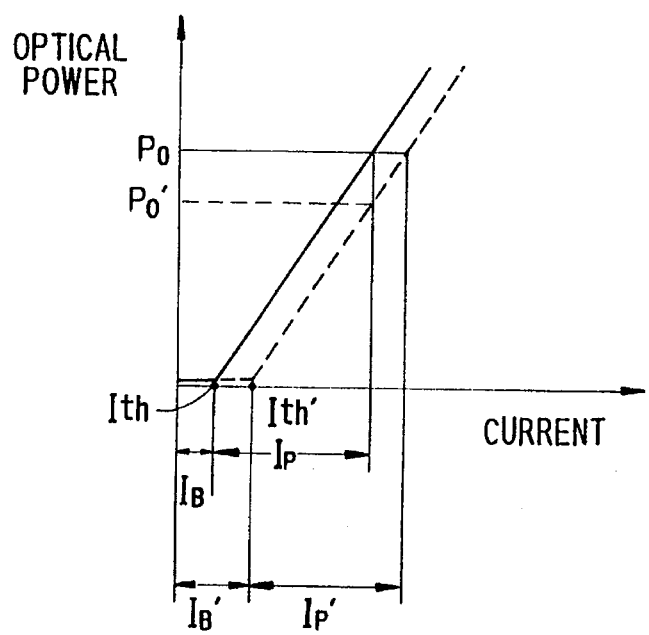
FIG. 21 is a diagram showing a characteristic of optical power vs. current in a semiconductor laser according to the prior art.

FIG. 19 is a diagram showing the construction of an optical transmission module for transmitting data on a plurality of channels. Here it is so arranged that bias currents can be adjusted individually at the semiconductor laser drives $10_1$, $10_2$, ... $10_n$. To this end, corresponding variable resistors $VR_{11}$, $VR_{12}$, ... $VR_{1n}$ for adjusting bias current are provided.

In a case where the temperature characteristics among the characteristics of the semiconductor lasers are uniform but the threshold-value current values differ for each channel, the thermisters $TH_{11}$, $TH_{11}'$ and the variable resistor $VR_{11}'$ for adjusting drive current are provided so as to be shared by the semiconductor laser drives and the variable resistors $VR_{11}$, $VR_{12}$ for adjusting bias current are provided for each individual semiconductor drive. The variable resistors $VR_{11}$, $VR_{12}$, ... $VR_{1n}$ are adjusted individually to make the bias currents equal to the threshold-value current.

Thus, in accordance with the present invention, a semiconductor laser drive is provided with a drive-current supply unit for passing a drive current through a semiconductor laser when input voltage is greater than a reference voltage or less than the reference voltage, a drive-current controller for controlling the value of drive current, and a reference-voltage generator for outputting the reference voltage and for lowering the level of the reference voltage in conformity with a temperature rise. Accordingly, even if the threshold-value current $I_{th}$ of the semiconductor laser increases owing to a rise in temperature and, hence, the delay time $t_d$ grows larger, it is possible to lower the reference voltage $V_{ref}$ correspondingly to increase the duty of the drive-current output. In addition, the time at which current starts flowing into the semiconductor laser 11 can be made earlier. As a result, a stabilized optical output power is obtained. Moreover, by making the drive current flow earlier, the delay time is offset so that a stabilized optical power waveform is obtained.

Further, in accordance with the present invention, the drive-current controller 14 is so constructed that the value of drive current $I_P$ increases in conformity with a rise in temperature. As a result, the value of current which flows through the semiconductor laser 11 can be increased in dependence upon a temperature rise, thereby making it possible to obtain an even more stabilized optical output power.

Furthermore, in accordance with the present invention, the reference voltage $V_{ref}$ or drive current $I_P$ is controlled in response to a fluctuation in temperature. By establishing the relation $I_{th}(T_0) > I_B$, therefore, it is not always necessary to adjust the bias current. Alternatively, the bias-current supply unit can be curtailed. This facilitates adjustment or makes it possible to reduce the number of points requiring adjustment.

In addition, in a case where a plurality of semiconductor laser drive sections are provided, points at which adjustment are required can be reduced by a wide margin owing to the arrangement in which the reference-voltage generator, the drive-current controller and the bias-current controller are provided so as to be shared by the plurality of semiconductor laser drive sections.

Furthermore, in accordance with the present invention, it is so arranged that a constant bias current and drive current flow even when the power-supply voltage fluctuates. This makes it possible to obtain stabilized optical output power and a stabilized optical power waveform.

Further, in a case where a plurality of semiconductor laser drives are provided, a bias-current adjusting unit, a drive-current adjusting unit, a bias-current temperature compensating unit and a drive-current temperature compensating unit are provided so as to be shared by the plurality of semiconductor laser drives. This makes it possible to reduce the amount of circuitry and to reduce the number of points requiring adjustment.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor laser drive for driving a semiconductor laser, comprising:

a drive-current supply unit for receiving an input voltage and a reference voltage and for passing a drive current through the semiconductor laser when said input voltage is greater than the reference voltage and when said input voltage is less than the reference voltage;

a drive-current controller for controlling a value of the drive current: and a reference-voltage generator for generating and outputting the reference voltage and for lowering the level of the reference voltage in dependence on a rise in a temperature of the laser, wherein said reference-voltage generator includes a voltage divider circuit having a resistor and a temperature-sensitive variable resistor element.

2. The drive according to claim 1, further comprising a bias-current supply unit for passing a prescribed bias current through said semiconductor laser.

3. The drive according to claim 2, further comprising a bias-current controller for controlling the bias current.

4. A semiconductor laser drive for driving a semiconductor laser, comprising:

a drive-current supply unit for receiving an input voltage and a reference voltage and for passing a drive current through the semiconductor laser when said input voltage is greater than the reference voltage and when said input voltage is less than the reference voltage;

a drive-current controller for controlling a value of the drive current; and a reference-voltage generator for generating and outputting the reference voltage and for lowering the level of the reference voltage in dependence on a rise in a temperature of the laser, wherein said reference-voltage generator includes a diode serially connected to a voltage divider circuit having a resistor.

5. The drive according to claim 1, wherein said drive-current controller increases the value of the drive current in dependence on a rise in temperature.

6. The drive according to claim 5, wherein said drive-current supply unit has a field-effect transistor provided in a path of the drive current, and said drive-current controller has a voltage divider circuit comprising a resistor and a temperature-sensitive variable resistor element, a power-supply voltage being voltage-divided by said voltage divider circuit, and a voltage which increases in dependence on a rise in temperature of the laser being applied to a gate terminal of said field-effect transistor.

7. A semiconductor laser drive for driving a semiconductor laser, comprising:

a drive-current supply unit for receiving an input voltage and a reference voltage and for passing a drive current through the semiconductor laser when said input voltage is greater than the reference voltage and when said input voltage is less than the reference voltage;

a drive-current controller for increasing a value of the drive current in dependence on a rise in temperature of the laser;

a monitoring light-receiving element for detecting optical power of said semiconductor laser; and a reference-voltage generator for generating the reference voltage in such a manner that the reference voltage is increased when the optical power is large and the reference voltage is decreased when the optical power is small.

8. A semiconductor laser drive for driving a semiconductor laser, comprising a plurality of semiconductor laser drive sections each having a drive-current supply unit for receiving an input voltage and a reference voltage and for passing a drive current through the semiconductor laser when the input voltage is greater than the reference voltage and when said input voltage is less than the reference voltage, and a bias-current supply unit for passing a prescribed bias current through the semiconductor laser;

a reference-voltage generator for generating a reference voltage having a level which declines in dependence on a rise in temperature of the laser; a drive-current controller for increasing a value of the drive current in dependence on a rise in temperature of the laser; and a bias-current controller for controlling a value of the bias current, said semiconductor laser drive sections sharing said reference-voltage generator, said drive-current controller and said bias-current controller.

9. A semiconductor laser drive having a drive-current supply unit for passing a drive current through a semiconductor laser when input data is at a high level and when input data is at a low level, and a bias-current supply unit for passing a prescribed bias current through the semiconductor laser, said bias-current supply unit including:

a first field-effect transistor having a drain terminal connected to a first power supply via a first resistor circuit, and a source terminal connected to a second power supply;

a voltage divider circuit for voltage-dividing a voltage across the first and second power supplies and applying the divided voltage to a gate terminal of said first field-effect transistor;

a second field-effect transistor having a drain terminal connected to the first power supply, a gate terminal connected to the drain terminal of the first field-effect transistor and a source terminal connected to the second power supply via a series circuit composed of a second resistor circuit and a variable resistor; and a third field-effect transistor having a drain terminal connected to a laser diode, a gate terminal connected to a junction of the second resistor circuit and the variable resistor, and a source terminal connected to the second power supply via a diode.

10. The drive according to claim 9, wherein said first resistor circuit is selected from the group consisting of a resistor, a series circuit composed of a diode and a resistor, and a temperature-sensitive variable resistor element.

11. The drive according to claim 10, wherein there are provided a plurality of semiconductor laser drive units each having one of the series circuit composed of the diode and the resistor, the temperature-sensitive variable resistor element, and said variable resistor externally fitted on the semiconductor laser drive units;

said externally fitted parts being shared by each of the semiconductor laser drive units and each of said externally fitted parts being connected to each of the semiconductor laser drive units.

12. The drive according to claim 9, wherein said second resistor circuit is selected from the group consisting of a resistor, a series circuit composed of a diode and a resistor, and a temperature-sensitive variable resistor element.

13. A semiconductor laser drive having a drive-current supply unit for passing a drive current through the semiconductor laser when input data is at a high level and when input data is at a low level, and a bias-current supply unit for passing a prescribed bias current through the semiconductor laser, said drive-current supply unit including:

a differential circuit including a pair of field-effect transistors wherein the semiconductor laser is connected to a drain terminal of one of the pair field-effect transistors turned on and off differentially by the input data;

a first field-effect transistor having a drain terminal connected to a first power supply via a first resistor circuit, and a source terminal connected to a second power supply;

a voltage divider circuit for voltage-dividing a voltage across the first and second power supplies and applying the divided voltage to a gate terminal of said first filed-effect transistor;

a second field-effect transistor having a drain terminal connected to the first power supply, a gate terminal connected to the drain terminal of the first field-effect transistor and a source terminal connected to the second power supply via a series circuit composed of a second resistor circuit and a variable resistor; and a third field-effect transistor having a drain terminal connected to source terminals of the field-effect transistors of said differential circuit, a gate terminal connected to a junction of the second resistor circuit and the variable resistor, and a source terminal connected to the second power supply via a diode.

14. The drive according to claim 13, wherein said first resistor circuit is selected from a group consisting of a resistor, a series circuit composed of a diode and a resistor, and a temperature-sensitive variable resistor element.

15. The drive according to claim 14, wherein there are provided a plurality of semiconductor laser drive units each having one of the series circuit composed of the diode and the resistor, the temperature-sensitive variable resistor element, and said variable resistor externally fitted on said semiconductor laser drive units;

said externally fitted parts being shared by each of the semiconductor laser drive units and each of said externally fitted parts being connected to each of the semiconductor laser drive units.

16. The drive according to claim 13, wherein said second resistor circuit is selected from a group consisting of a resistor, a series circuit composed of a diode and a resistor, and a temperature-sensitive variable resistor element.

* * * * *